United States Patent
Fukuda et al.

(10) Patent No.: US 8,036,021 B2
(45) Date of Patent: Oct. 11, 2011

(54) SEMICONDUCTOR MEMORY DEVICE

(75) Inventors: Ryo Fukuda, Yokohama (JP);
Daisaburo Takashima, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 12/620,822

(22) Filed: Nov. 18, 2009

(65) Prior Publication Data

US 2010/0067284 A1    Mar. 18, 2010

Related U.S. Application Data

(62) Division of application No. 11/964,260, filed on Dec. 26, 2007, now Pat. No. 7,697,318.

(30) Foreign Application Priority Data

Dec. 26, 2006   (JP) .................................. 2006-348870

(51) Int. Cl.
*G11C 11/14* (2006.01)
(52) U.S. Cl. ...................................... 365/149
(58) Field of Classification Search .................. 365/149
See application file for complete search history.

(56) References Cited

U.S. PATENT DOCUMENTS

| | | | |
|---|---|---|---|
| 6,984,857 B2 | 1/2006 | Udayakumar et al. | |
| 2003/0169616 A1* | 9/2003 | Noro ............................. | 365/145 |
| 2006/0047034 A1* | 3/2006 | Sakurai et al. ................. | 524/236 |

FOREIGN PATENT DOCUMENTS

| | | |
|---|---|---|
| JP | 11-026719 | 1/1999 |
| JP | 2000-049304 | 2/2000 |
| JP | 2002-133892 | 5/2002 |
| JP | 2004-221473 | 8/2004 |

OTHER PUBLICATIONS

Yanagiya et al., "65nm CMOS Technology (CMOS5) with High Density Embedded Memories for Broadband Microprocessor Applications" IEEE, 2002; p. 57-60.
Office Action received for corresponding Japanese Patent Application 2006-348870 mailed Mar. 1, 2011.
Office Action received for corresponding Japanese Patent Application 2006-348870 mailed on Jul. 19, 2011.

\* cited by examiner

*Primary Examiner* — Amir Zarabian
*Assistant Examiner* — Anthan Tran
(74) *Attorney, Agent, or Firm* — Banner & Witcoff, Ltd.

(57) ABSTRACT

A memory cell array includes a plurality of memory cells arranged at intersections of bit line pairs and word lines. Each memory cell includes a first transistor having one main electrode connected to a first bit line, a second transistor having one main electrode connected to a second bit line, a first node electrode for data-storage connected to the other main electrode of the first transistor, a second node electrode for data-storage connected to the other main electrode of the second transistor, and a shield electrode formed surrounding the first and second node electrodes. The first and second transistors have respective gates both connected to an identical word line, and the first and second bit lines are connected to an identical sense amp. The first and second node electrodes, the first and second bit lines, the word line and the shield electrode are isolated from each other using insulating films.

3 Claims, 19 Drawing Sheets

SEMICONDUCTOR MEMORY DEVICE

CROSS-REFERENCE TO RELATED APPLICATION

This application is a Divisional application of co-pending U.S. application Ser. No. 11/964,260, filed Dec. 26, 2007, which is based on and claims the benefit of priority from prior Japanese Patent Application No. 2006-348870, filed on Dec. 26, 2006, the entire contents of which are incorporated herein by reference.

FIELD OF THE INVENTION

The present invention relates to a semiconductor memory device, and more particularly to a DRAM (dynamic random access memory).

BACKGROUND OF THE INVENTION

There are various kinds of commercially-available semiconductor memory devices. Memories with relatively larger capacity and lower power consumption include an SRAM (static random access memory). The SRAM has problems, however, because variations in threshold voltage result in unstable operation, and leakage current flowing in turned-off transistors increases power consumption.

On the other hand, semiconductor memory devices suitable for high integration include a DRAM. A method of forming a DRAM with multi-layered wiring for much higher integration is disclosed in Japanese Patent Laying-open No. 2002-133892, which is incorporated herein by reference. The DRAM thus formed usually requires formation of capacitors. Since the capacitors needs processes different from a CMOS processes. Accordingly, it is difficult to manufacture the DRAM through CMOS process only.

Therefore, it is advantageous in a semiconductor memory device that a DRAM can be formed through a general CMOS process, and to provide a DRAM-combined semiconductor memory device manufacturable at a lower production cost.

SUMMARY OF THE INVENTION

In an aspect the present invention provides a semiconductor memory device, comprising: a memory cell array including a plurality of memory cells arranged at intersections of bit line pairs and word lines, wherein each of the memory cells includes a first transistor having one main electrode connected to a first bit line, a second transistor having one main electrode connected to a second bit line, a first node electrode for data-storage connected to the other main electrode of the first transistor, a second node electrode for data-storage connected to the other main electrode of the second transistor, and a shield electrode formed surrounding the first and second node electrodes, wherein the first transistor and the second transistor have respective gates both connected to an identical word line, wherein the first bit line and the second bit line are connected to an identical sense amp, wherein the first node electrode, the second node electrode, the first bit line, the second bit line, the word line and the shield electrode are isolated from each other using insulating films.

In another aspect the present invention provides a semiconductor memory device, comprising: a memory cell array including a plurality of memory cells arranged at intersections of bit line pairs and word lines, wherein each of the memory cells includes a transistor having one main electrode connected to one bit line of the bit line pair, a node electrode for data-storage connected to the other main electrode of the transistor, and a shield electrode formed surrounding the node electrode, wherein the transistor has a gate connected to the word line, wherein the bit line pair is connected to an identical sense amp, wherein the bit line pair, the word line, the node electrode and the shield electrode are isolated from each other using insulating films.

In another aspect the present invention provides a semiconductor memory device, comprising: a memory cell array including a plurality of memory cells arranged at intersections of bit line pairs and word lines, the memory cell including a first electrode layer containing a first transistor having one main electrode connected to a first bit line, a second transistor having one main electrode connected to a second bit line, a first node electrode connected to the other main electrode of the first transistor, and a second node electrode connected to the other main electrode of the second transistor, a second electrode layer formed on the first electrode layer and containing a third and a fourth node electrode connected via respective interlayer contact electrodes to the first and second node electrodes, and a power supply electrode surrounding the third and fourth node electrodes, a third electrode layer formed on the second electrode layer and containing a fifth and a sixth node electrode connected via respective interlayer contact electrodes to the third and fourth node electrodes, and an electrode surrounding the fifth and sixth node electrodes at least in part and serving as a word line, wherein the first transistor and the second transistor have respective gates both connected to an identical word line, wherein the first bit line and the second bit line are connected to an identical sense amp, wherein said first node electrode, said second node electrode, said third node electrode, said fourth node electrode, said fifth node electrode, said sixth node electrode, said bit lines, said power supply electrode, and said electrode serving as said word line are isolated from each other using insulating films.

DETAILED DESCRIPTION OF THE EMBODIMENTS

One embodiment of the present invention will now be described below.

Figure 1:
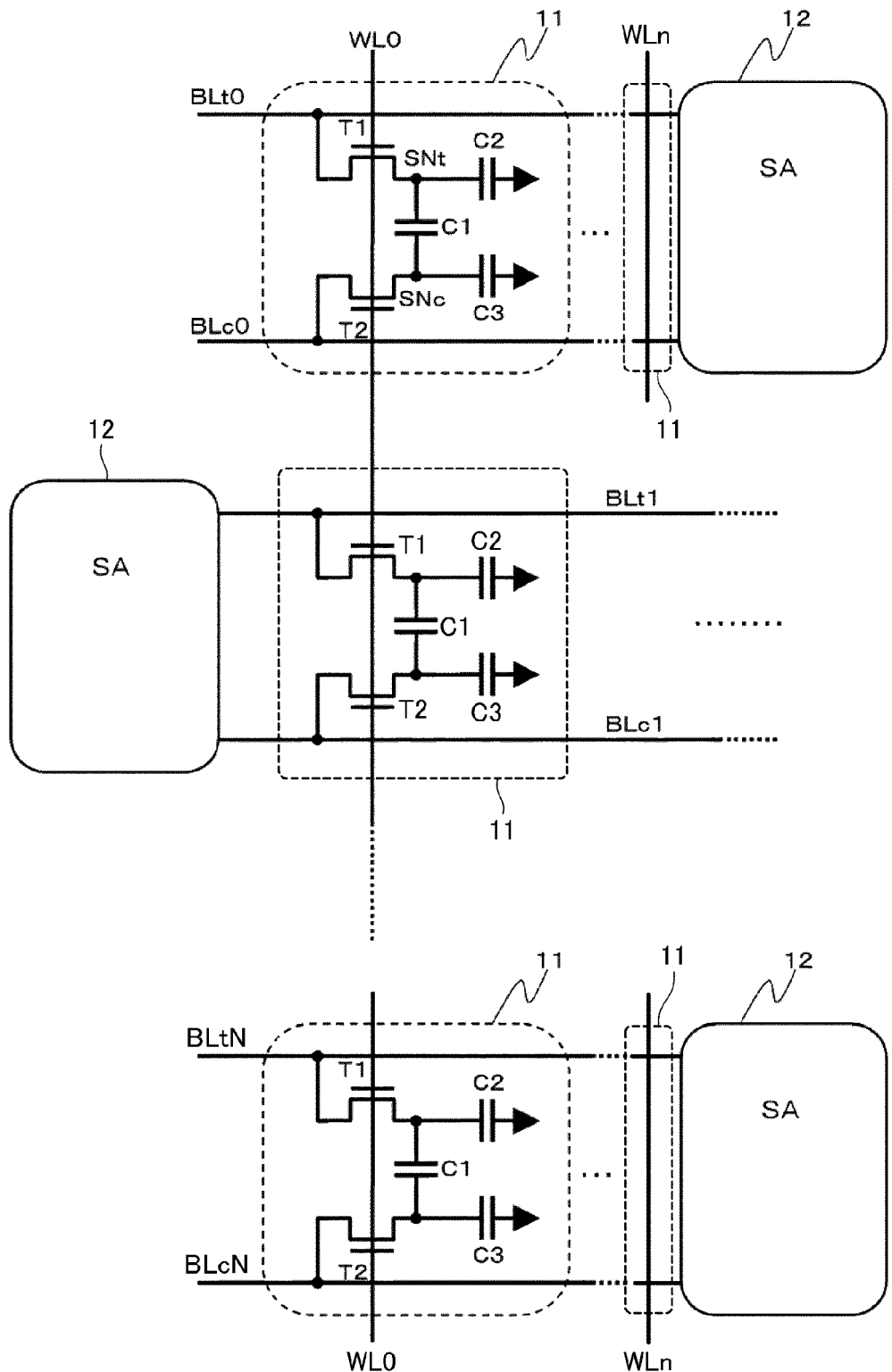
FIG. 1 is a diagram showing a circuit of a semiconductor memory device in accordance with one embodiment.

FIG. 1 shows a circuit diagram of memory cells in the present embodiment. A memory cell array in the present embodiment includes two types of complementary bit lines. The number of the bit lines is (N+1), respectively. Specifically, it includes bit lines BLtk, BLck (k=0-N). The number of word lines is (M+1). Specifically, it includes word lines WLj (j=0-M). The memory cells 11 in the present embodiment are formed in regions at intersections of the complementary bit lines BLtk, BLck (k=0-N) and the word lines WLj (j=0-M). For example, a memory cell 11 is formed in a region at an intersection of complementary bit lines BLt0, BLc0 and a word line WL0 as shown in FIG. 1.

A memory cell 11 includes two N-type MOS transistors T1, T2 and three capacitors C1, C2, C3. The N-type MOS transistor T1 has a source connected to the bit line BLt0, and the N-type MOS transistor T2 has a source connected to the bit line BLc0. The N-type MOS transistor T1 and the N-type MOS transistor T2 have respective gates, which are both connected to the word line WL0.

The N-type MOS transistor T1 and the N-type MOS transistor T2 have respective drains, between which both electrodes of the capacitor C1 are connected. In addition, the drain of the N-type MOS transistor T1 is connected to the capacitor C2. And the drain of the N-type MOS transistor T2 is connected to the capacitor C3. Thus, the connection region between the drain of the N-type MOS transistor T1 and the capacitor C2 forms a data-storage node SNt. The connection region between the drain of the N-type MOS transistor T2 and the capacitor C3 forms a data-storage node SNc. The complementary bit lines BLt0, BLc0 are connected to a sense amp (SA) 12, which can read out stored information.

Figure 2:
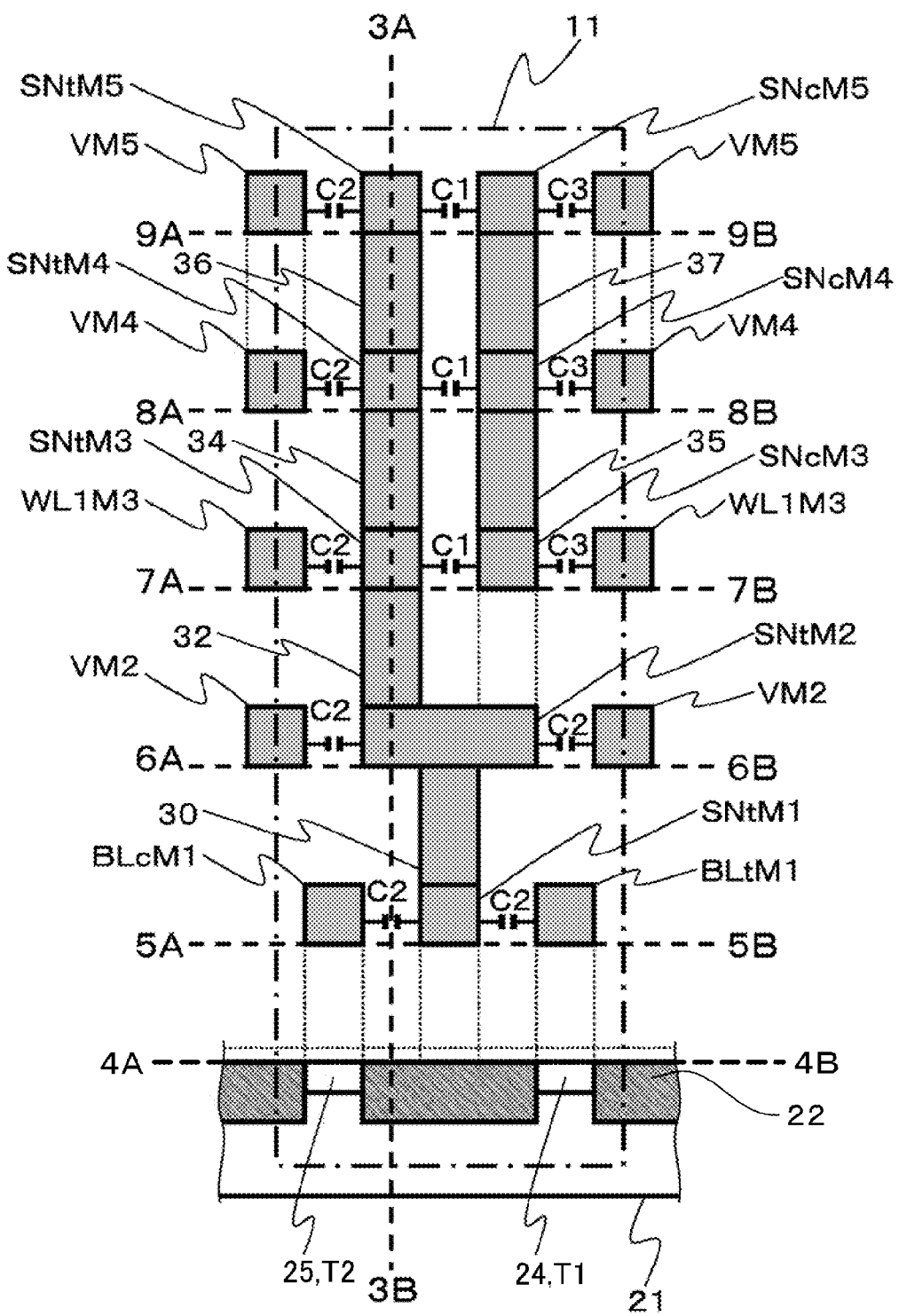
FIG. 2 is a cross-sectional view of a memory cell in the semiconductor memory device in accordance with one embodiment taken in a direction vertical to a substrate.
Figure 3:
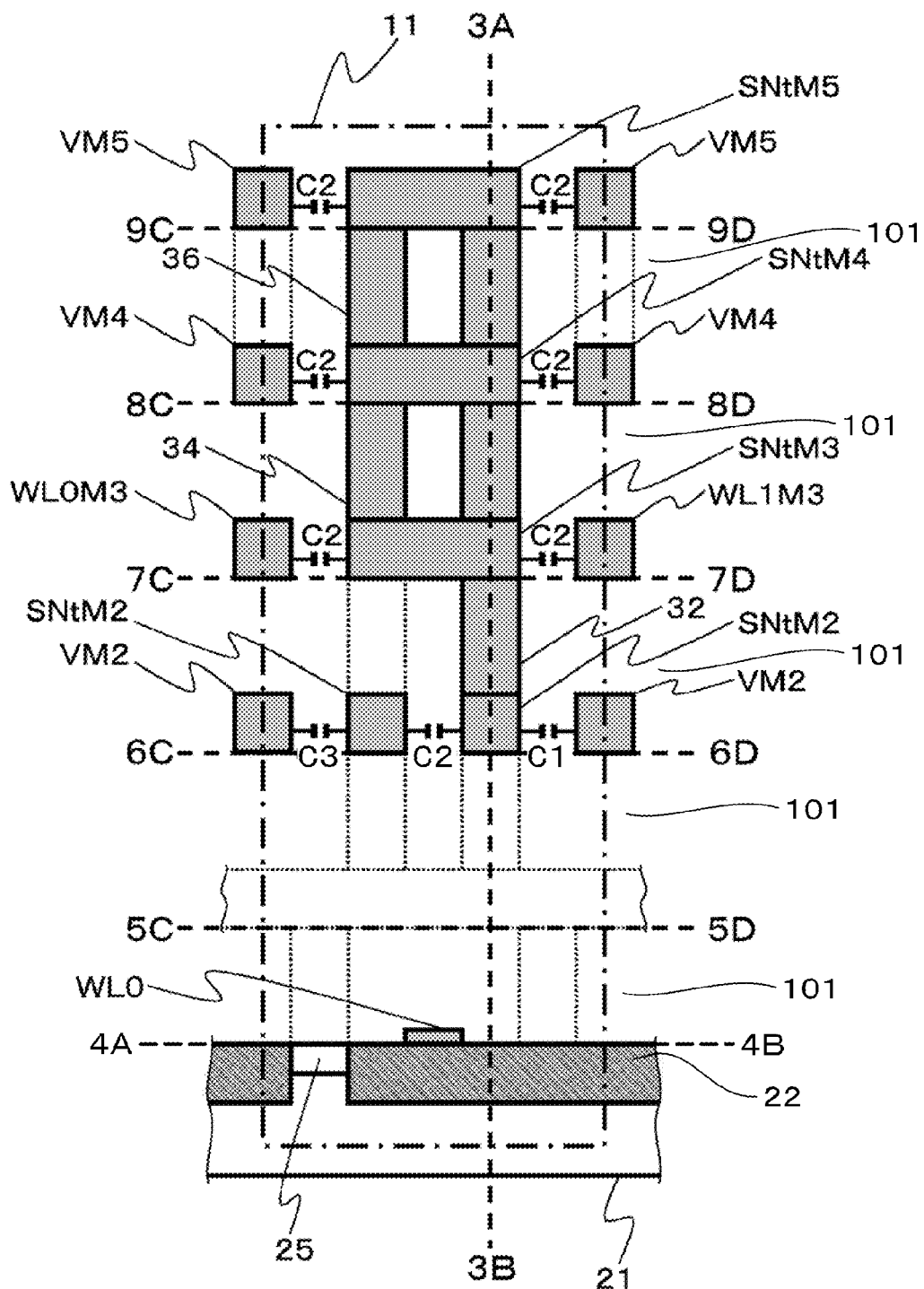
FIG. 3 is a cross-sectional view of the memory cell in the semiconductor memory device in accordance with one embodiment taken in a direction vertical to the substrate.
Figure 4:
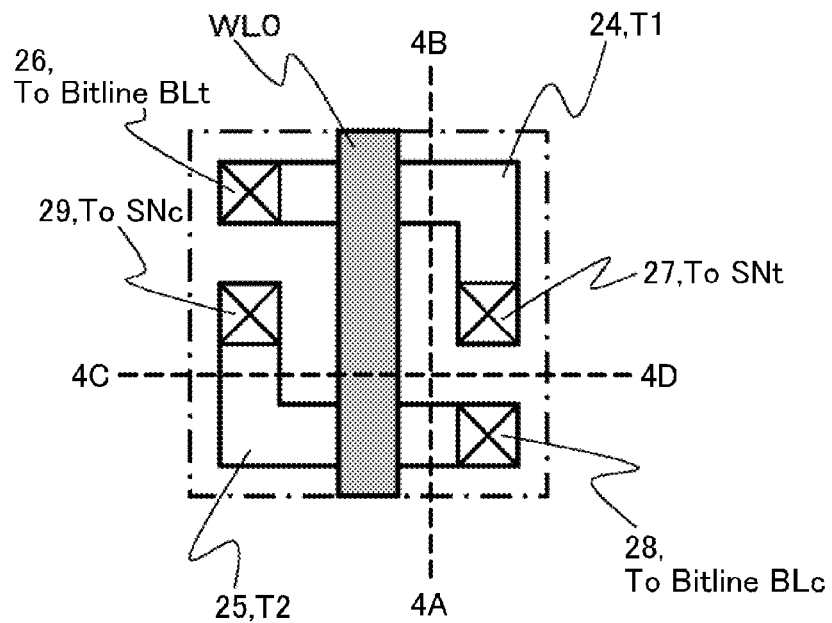
FIG. 4 is a plan view of a semiconductor substrate for the memory cell in the semiconductor memory device in accordance with one embodiment.
Figure 5:
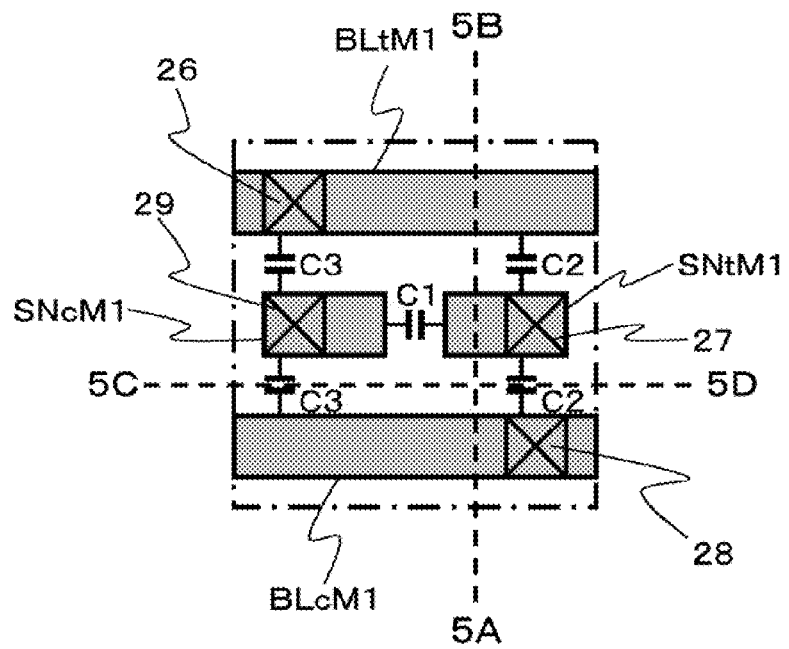
FIG. 5 is a cross-sectional view of the memory cell in the semiconductor memory device in accordance with one embodiment taken in a direction parallel with FIG. 4.
Figure 6:
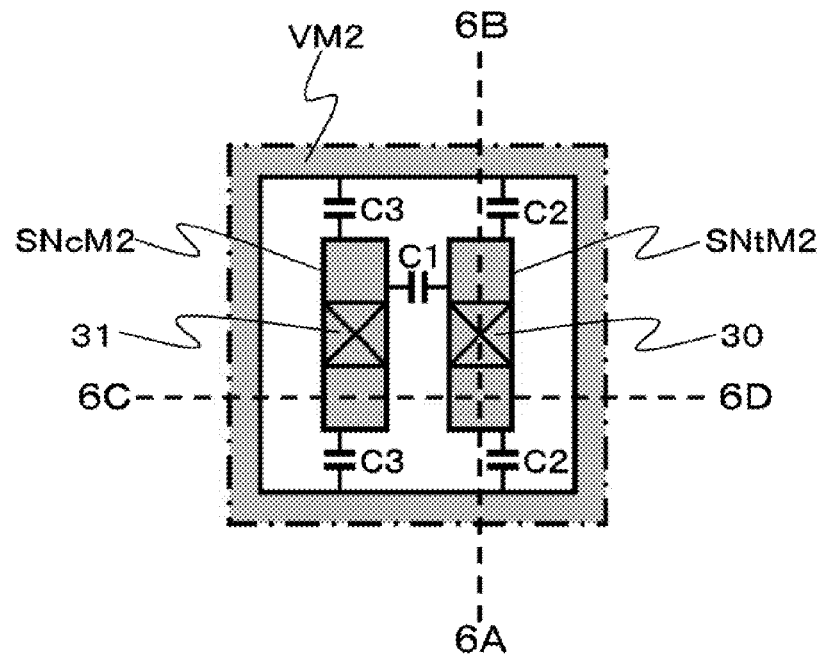
FIG. 6 is a cross-sectional view of the memory cell in the semiconductor memory device in accordance with one embodiment taken in a direction parallel with FIG. 4.
Figure 7:
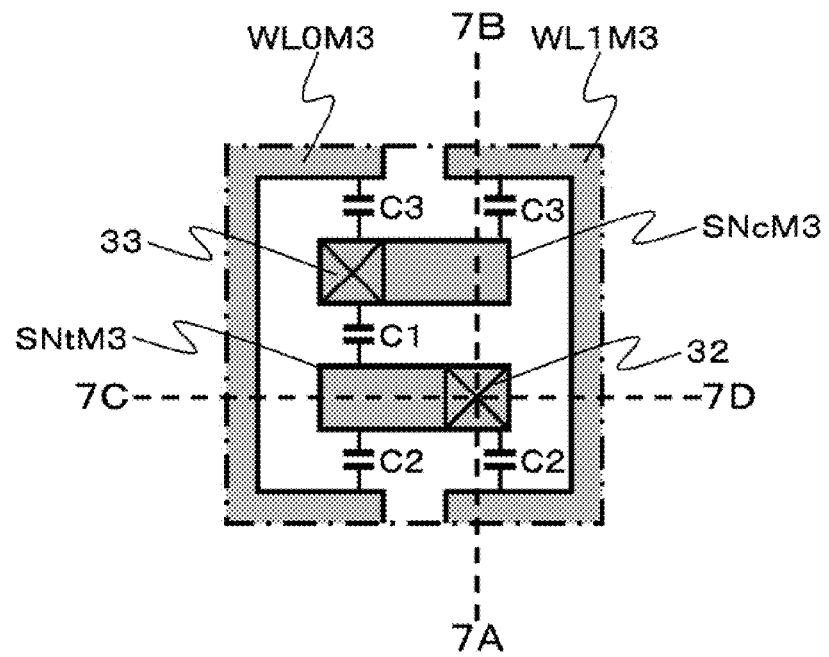
FIG. 7 is a cross-sectional view of the memory cell in the semiconductor memory device in accordance with one embodiment taken in a direction parallel with FIG. 4.
Figure 8:
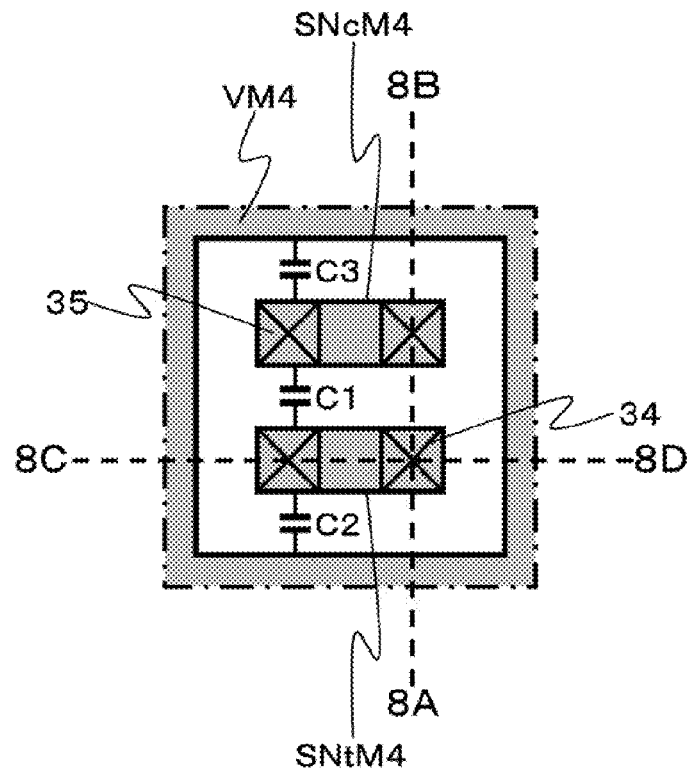
FIG. 8 is a cross-sectional view of the memory cell in the semiconductor memory device in accordance with one embodiment taken in a direction parallel with FIG. 4.

FIGS. 2-9 show a specific structure of the memory cell 11 for one bit shown in FIG. 1. FIGS. 2 and 3 are cross-sectional views taken in a direction vertical to a semiconductor substrate 21. FIG. 2 is a cross-sectional view taken vertical to the semiconductor substrate 21 along the line 3A-3B. FIG. 3 is also a cross-sectional view taken along the line 3A-3B but has an angle of 90 degrees from the cross-sectional view of FIG. 2. FIGS. 4-9 are cross-sectional views taken in a direction parallel with the semiconductor substrate 21. Namely, they are cross-sectional views vertical to the sections of FIGS. 2 and 3. FIG. 4 is a cross-sectional view taken along the line 4A-4B in FIG. 2 and the line 4C-4D in FIG. 3. FIG. 5 is a cross-sectional view taken along the line 5A-5B in FIG. 2 and the line 5C-5D in FIG. 3. FIG. 6 is a cross-sectional view taken along the line 6A-6B in FIG. 2 and the line 6C-6D in FIG. 3. FIG. 7 is a cross-sectional view taken along the line 7A-7B in FIG. 2 and the line 7C-7D in FIG. 3. FIG. 8 is a cross-sectional view taken along the line 8A-8B in FIG. 2 and the line 9C-9D in FIG. 3.

The present embodiment is directed to a semiconductor memory device having a multi-layered structure, which includes interlayer insulators 101 formed on the surface of the semiconductor substrate 21, and wiring patterns serving as electrodes formed between the interlayer insulators 101 three-dimensionally. This structure is described on the basis of FIGS. 2 and 3, layer by layer to be formed, based on FIGS. 4-9. A region surrounded by a dashed-chain line in the figures shows a memory cell region for one bit.

In the present embodiment, active regions 24 and 25 are formed in the semiconductor substrate 21 as shown in FIG. 4. The active region 24 is used to form a source region, a drain region and a channel region (not shown) of the transistor T1. The active region 25 is used to form a source region, a drain region and a channel region (not shown) of the transistor T2. Electrodes are formed on these regions.

The semiconductor substrate 21 includes a device isolation layer (STI) 22 formed therein. The isolation layer 22 contributes to isolation between plural memory cells 11 and also contributes to isolation between the transistors T1 and T2 in one memory cell 11. Further, the word line WL0 is formed over the semiconductor substrate 21 and the isolation layer (STI) 22 formed in the surface thereof. Specifically, the word line WL0 is formed on the channel region of the transistor T1 in the active region 24 and on the channel region of the transistor T2 in the active region 25, with a gate insulator, not shown, interposed therebetween. The word line WL0 serves as gate electrodes of the transistors T1 and T2.

An interlayer insulator 101 is formed on the semiconductor substrate 21, and an interlayer contact electrode 26 is formed through the interlayer insulator 101 down to the active region 24 used to form the transistor T1. The bit line BLt and the source region of the transistor T1 formed in the active region 24 are connected to each other via the interlayer contact electrode 26. The data-storage node SNt and the transistor T1 are connected to each other via an interlayer contact electrode 27. Similarly, an interlayer contact electrode 28 is formed through the interlayer insulator 101 down to the active region 25 used to form the transistor T2. The bit line BLc and the transistor T2 are connected to each other via the interlayer contact electrode 28. The data-storage node SNc and the transistor T2 are connected to each other via an interlayer contact electrode 29.

FIG. 5 is a cross-sectional view taken along the line 5A-5B in FIG. 2 and the line 5C-5D in FIG. 3. In the section of FIG. 5, an electrode BLtM1 serving as the bit line BLt, an electrode BLcM1 serving as the bit line BLc, an electrode SNtM1 serving as the data-storage node SNt, and an electrode SNcM1 serving as the data-storage node SNc are formed.

As described above, the electrode BLtM1 serving as the bit line BLt is connected to the transistor T1 via the interlayer contact electrode 26, and the electrode SNtM1 serving as the data-storage node SNt is connected to the transistor T1 via the interlayer contact electrode 27.

In addition, the electrode BLcM1 serving as the bit line BLc is connected to the transistor T3 via the interlayer contact electrode 28, and the electrode SNcM1 serving as the data-storage node SNc is connected to the transistor T2 via the interlayer contact electrode 29.

In the section of FIG. 5, the electrode SNtM1 serving as the data-storage node SNt, the electrode SNcM1 serving as the data-storage node SNc, and the interlayer insulator 101 sandwiched between these two electrodes SNtM1 and SNcM1 form the capacitor C1.

In addition, the region sandwiched between the electrode SNtM1 serving as the data-storage node SNt and the electrode BLtM1 serving as the bit line BLt, and the interlayer insulator 101 sandwiched between the electrode SNtM1 serving as the data-storage node SNt and the electrode BLcM1 serving as the bit line BLc form the capacitor C2.

Further, the region sandwiched between the electrode SNcM1 serving as the data-storage node SNc and the electrode BLtM1 serving as the bit line BLt, and the interlayer insulator 101 sandwiched between the electrode SNcM1 serving as the data-storage node SNc and the electrode BLcM1 serving as the bit line BLc form the capacitor C3. An interlayer insulator 101 is formed over these electrodes BLtM1, BLcM1, SNtM1, SNcM1, and then electrode patterns in the next layer are formed thereon.

FIG. 6 is a cross-sectional view taken along the line 6A-6B in FIG. 2 and the line 6C-6D in FIG. 3. In the section of FIG. 6, an electrode VM2 for supplying power, an electrode SNtM2 serving as the data-storage node SNt, and an electrode SNcM2 serving as the data-storage node SNc are formed. The electrode SNtM2 serving as the data-storage node SNt is connected to the electrode SNtM1 via an interlayer contact electrode 30, and the electrode SNcM2 serving as the data-storage node SNc is connected to the electrode SNcM1 via an interlayer contact electrode 31. The electrode VM2 is formed in a closed-loop surrounding the two electrodes SNtM2 and SNcM2.

In the section of FIG. 6, the interlayer insulator 101 sandwiched between the electrode SNtM2 serving as the data-storage node SNt and the electrode SNcM2 serving as the data-storage node SNc forms the capacitor C1. In addition, the interlayer insulator 101 sandwiched between the electrode SNtM2 serving as the data-storage node SNt and the electrode VM2 for supplying power forms the capacitor C2. Further, the interlayer insulator 101 sandwiched between the electrode SNcM2 serving as the data-storage node SNc and the electrode VM2 for supplying power forms the capacitor C3. An interlayer insulator 101 is formed over these electrodes SNtM2, SNcM2, VM2, and then electrode patterns in the next layer (FIG. 7) are formed.

FIG. 7 is a cross-sectional view taken along the line 7A-7B in FIG. 2 and the line 7C-7D in FIG. 3. In this section, an electrode WL0M3 serving as the word line WL0, an electrode WL1M3 serving as an adjacent word line WL1, an electrode SNtM3 serving as the data-storage node SNt, and an electrode SNcM3 serving as the data-storage node SNc are formed. The electrode SNtM3 serving as the data-storage node SNt is connected to the electrode SNtM2 via an interlayer contact electrode 32. The electrode SNcM3 serving as the data-storage node SNc is connected to the electrode SNtM2 via an interlayer contact electrode 33. The electrode WL0M3 serving as the word line WL0 and the electrode WL1M3 serving as an adjacent word line WL1 are formed surrounding the two nodes SNtM3, SNcM3.

In the section of FIG. 7, the interlayer insulator 101 sandwiched between the electrode SNtM3 serving as the data-storage node SNt and the electrode SNcM3 serving as the data-storage node SNc forms the capacitor C1. In addition, the region sandwiched between the electrode SNtM3 serving as the data-storage node SNt and the electrode WL0M3 serving as the word line WL0, and the interlayer insulator 101 sandwiched between the electrode SNtM3 serving as the data-storage node SNt and the electrode WL1M3 serving as the word line WL1 form the capacitor C2. Further, the region sandwiched between the electrode SNcM3 serving as the data-storage node SNc and the electrode WL0M3 serving as the word line WL0, and the interlayer insulator 101 sandwiched between the electrode SNcM3 serving as the data-storage node SNc and the electrode WL1M3 serving as the word line WL1 form the capacitor C3. An interlayer insulator 101 is formed over these electrodes SNtM3, SNcM3, WL0M3, WL1M3, and then electrode patterns in the next layer (FIG. 8) are formed.

FIG. 8 is a cross-sectional view taken along the line 8A-8B in FIG. 2 and the line 8C-8D in FIG. 3. In the section of FIG. 8, an electrode VM4 for supplying power, an electrode SNtM4 serving as the data-storage node SNt, and an electrode SNcM4 serving as the data-storage node SNc are formed. The electrode SNtM4 serving as the data-storage node SNt is connected to the electrode SNtM3 via an interlayer contact electrode 34, and the electrode SNcM4 serving as the data-storage node SNc is connected to the electrode SNcM3 via an interlayer contact electrode 35. Although the present embodiment forms two interlayer contact electrodes, that is, the interlayer contact electrodes 34 and 35, only one may be sufficient. By forming plural interlayer contact electrodes 34 and 35, capacitive components formed between the interlayer contact electrodes 34 and 35 serves to increase the capacities of the capacitors C1, C2 and C3. In this way, it is possible to additionally increase the capacities of the capacitors C1, C2 and C3. The electrode VM4 is formed in a closed-loop surrounding the two electrodes SNtM4 and SNcM4.

In the section of FIG. 8, the interlayer insulator 101 sandwiched between the electrode SNtM4 serving as the data-storage node SNt and the electrode SNcM4 serving as the data-storage node SNc forms the capacitor C1.

In addition, the interlayer insulator 101 sandwiched between the electrode SNtM4 serving as the data-storage node SNt and the electrode VM4 for supplying power forms the capacitor C2. Further, the interlayer insulator 101 sandwiched between the electrode SNcM4 serving as the data-storage node SNc and the electrode VM4 for supplying power forms the capacitor C3. An interlayer insulator 101 is formed over these electrodes, and then electrode patterns in the next layer (FIG. 9) are formed.

Figure 9:
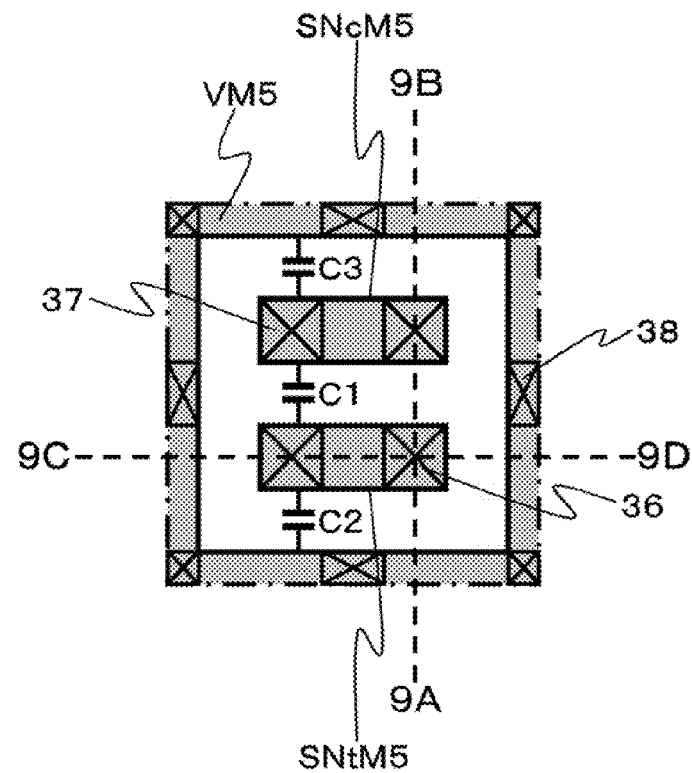
FIG. 9 is a cross-sectional view of the memory cell in the semiconductor memory device in accordance with one embodiment taken in a direction parallel with FIG. 4.

FIG. 9 is a cross-sectional view taken along the line 9A-9B in FIG. 2 and the line 9C-9D in FIG. 3. In this section, an electrode VM5 for supplying power, an electrode SNtM5 serving as the data-storage node SNt, and an electrode SNcM5 serving as the data-storage node SNc are formed. The electrode SNtM5 serving as the data-storage node SNt is connected to the electrode SNtM4 via an interlayer contact electrode 36, and the electrode SNcM5 serving as the data-storage node SNc is connected to the electrode SNcM4 via an interlayer contact electrode 37. The electrode VM5 is connected to the electrode VM4 via an interlayer contact electrode 38. The electrode VM5 is formed in a closed-loop surrounding the two electrodes SNtM5 and SNcM5.

Although the present embodiment forms a plurality of the interlayer contact electrodes 36, 37 and 38, only one may be sufficient. If a plurality of the interlayer contact electrodes 36, 37 and 38 are formed, capacitive components formed between the interlayer contact electrodes contribute for increasing capacities of the capacitors C1, C2 and C3 to additionally increase the capacities of the capacitors C1, C2 and C3.

In the section of FIG. 9, the interlayer insulator 101 sandwiched between the electrode SNtM5 serving as the data-storage node SNt and the electrode SNcM5 serving as the data-storage node SNc forms the capacitor C1. In addition, the interlayer insulator 101 sandwiched between the electrode SNtM5 serving as the data-storage node SNt and the electrode VM5 for supplying power forms the capacitor C2. Further, the interlayer insulator 101 sandwiched between the electrode SNcM5 serving as the data-storage node SNc and the electrode VM5 for supplying power forms the capacitor C3.

Although not shown, through formation of an interlayer insulator on the top surface of the three-dimensionally structured memory cell thus formed, and then a metal film thereon, an additional increase in capacity can be achieved. For the bit lines BLtk (k=0-N) and BLck (k=0-N), formation of paired bit lines as intersecting makes it possible to suppress noises between the bit lines. It is also possible to prevent a phenomenon in which bit lines have uneven capacities due to alignment and so forth during exposure on production.

In the present embodiment, the memory cell 11 is surrounded by the electrodes VM2, VM4, and VM5 for forming power supplies. The electrodes are not limited to such the electrodes but rather may include those other than for power supplies so long as they can increase the capacities of the capacitors C1, C2, and C3.

Figure 10:
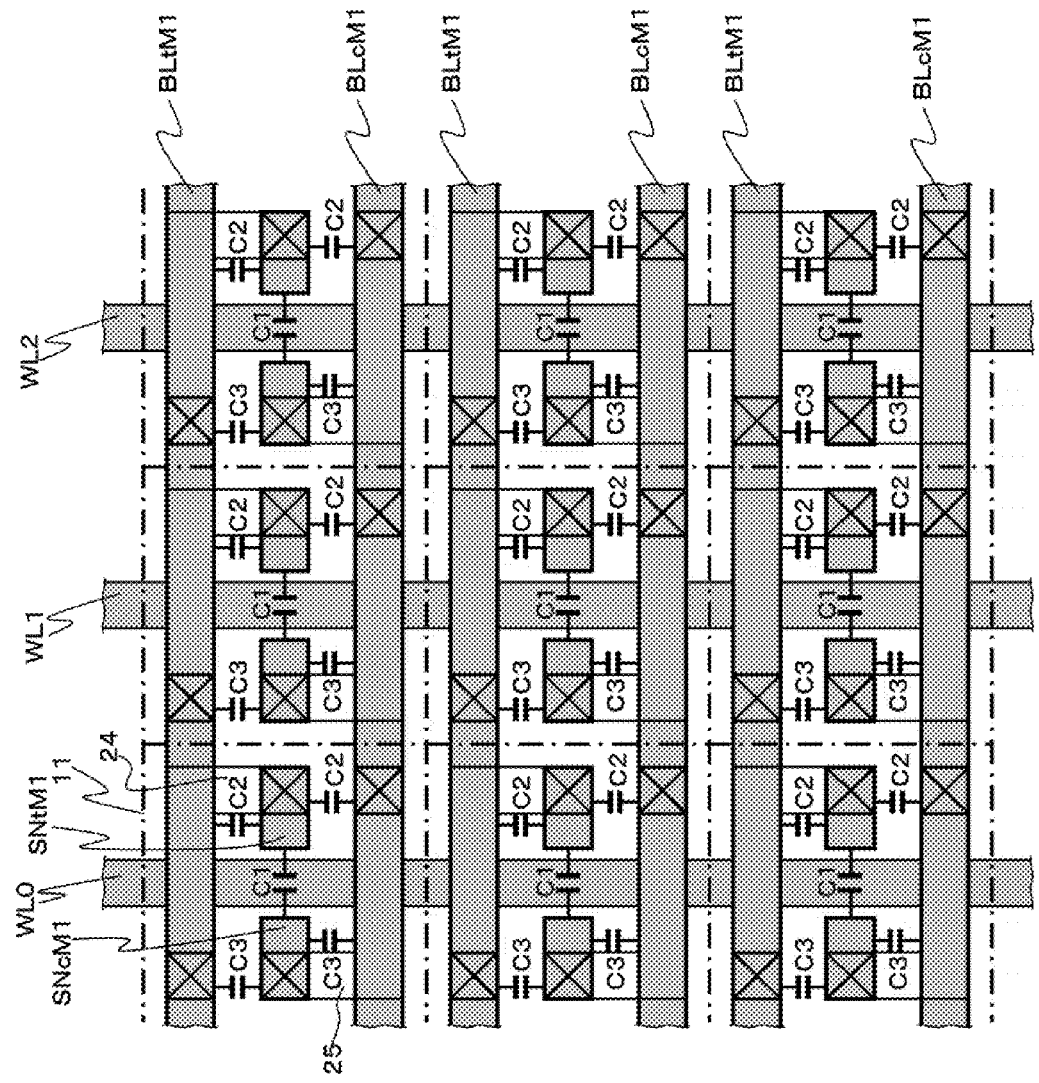
FIG. 10 is a surface arrangement diagram of a memory cell array in the semiconductor memory device in accordance with one embodiment.

FIG. 10 shows an arrangement of a memory cell array including the memory cells 11 formed therein in the present embodiment superimposing FIG. 4 on FIG. 5. The memory cells 11 are formed two-dimensionally. In each of the memory cells 11, the transistors T1, T2 are formed in the active regions 24 and 25.

The interlayer insulators 101 sandwiched between the electrodes BLtM1, BLcM1, SNtM1, and SNcM1 form the capacitors C1, C2, and C3. Three-dimensional formation of the two-dimensionally formed memory cells 11 allows the interlayer insulators 101 sandwiched between the electrodes in the upper and lower layers to form the capacitors C1, C2, and C3. As a result, the total capacity of the whole memory cells becomes sufficient for DRAM operation. In a usual CMOS process, a silicon oxide (such as $SiO_2$) having a relative permittivity of 5 or below is used as the interlayer insulator for a reduction in parasitic capacity. Even in such the case, the memory cells three-dimensionally structured in accordance with the present embodiment make it possible to ensure necessary and sufficient capacities for DRAM operation.

The present embodiment allows the interlayer insulators to be used as capacitors in a DRAM. As a result, the usual CMOS process can be used to obtain a DRAM having a cell area equal to 60% or below of that of the SRAM.

A second embodiment is directed to the memory cell 11 having the circuitry shown in FIG. 1 and relates to an additionally space-reduced, three-dimensionally structured memory cell.

Figure 11:
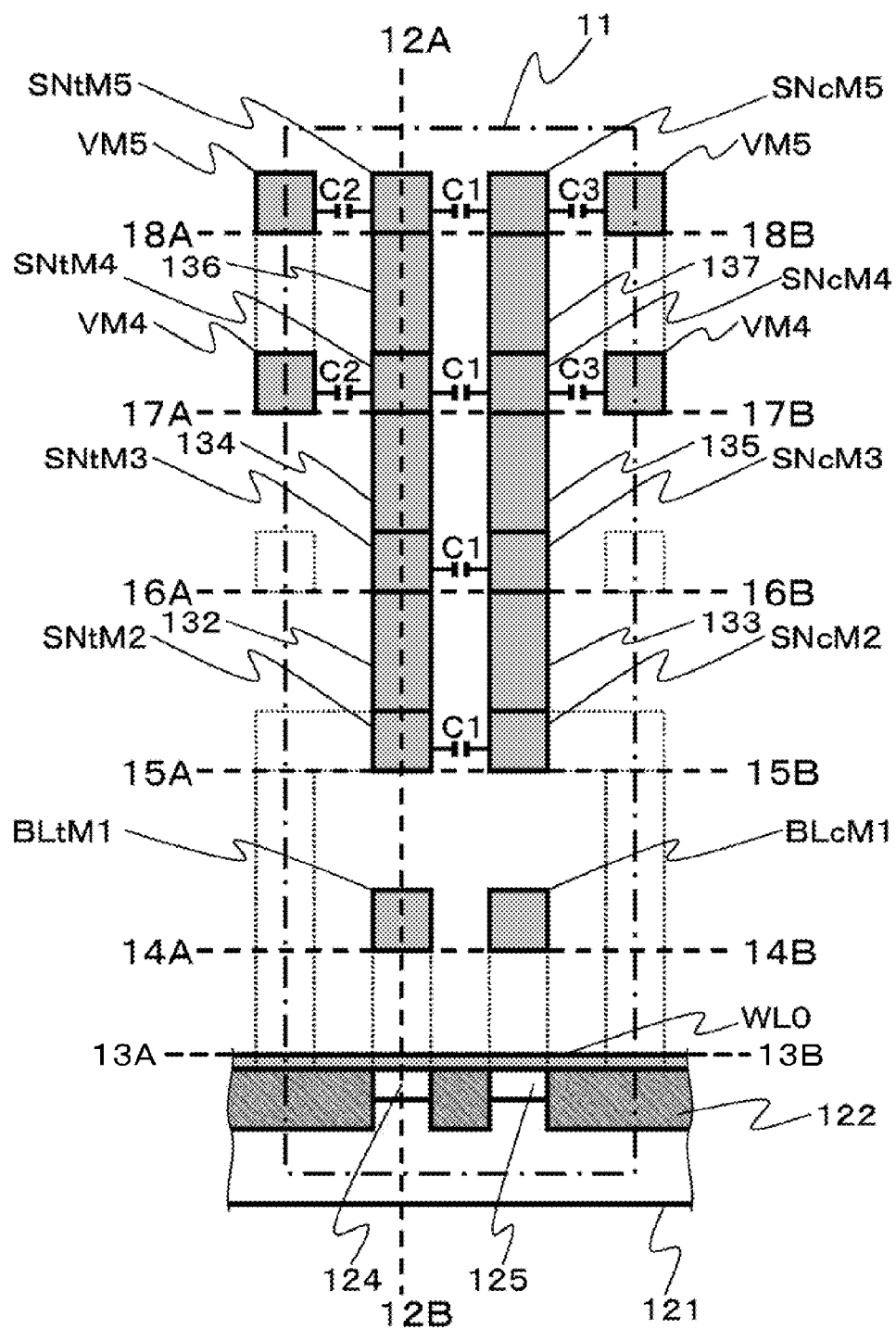
FIG. 11 is a cross-sectional view of a memory cell in a semiconductor memory device in accordance with another embodiment taken in a direction vertical to a substrate.
Figure 12:
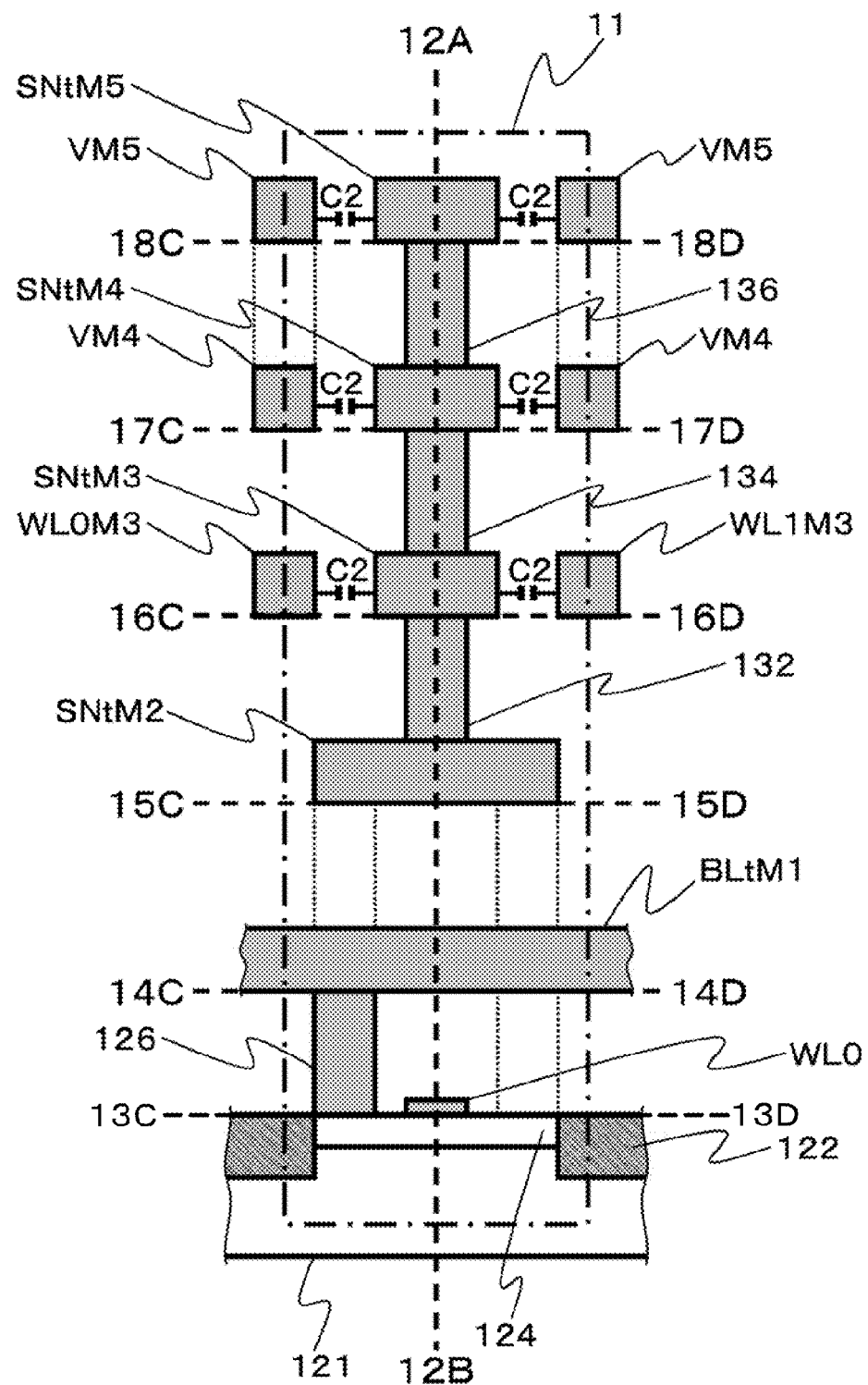
FIG. 12 is a cross-sectional view of the memory cell in the semiconductor memory device in accordance with another embodiment taken in a direction vertical to the substrate.
Figure 13:
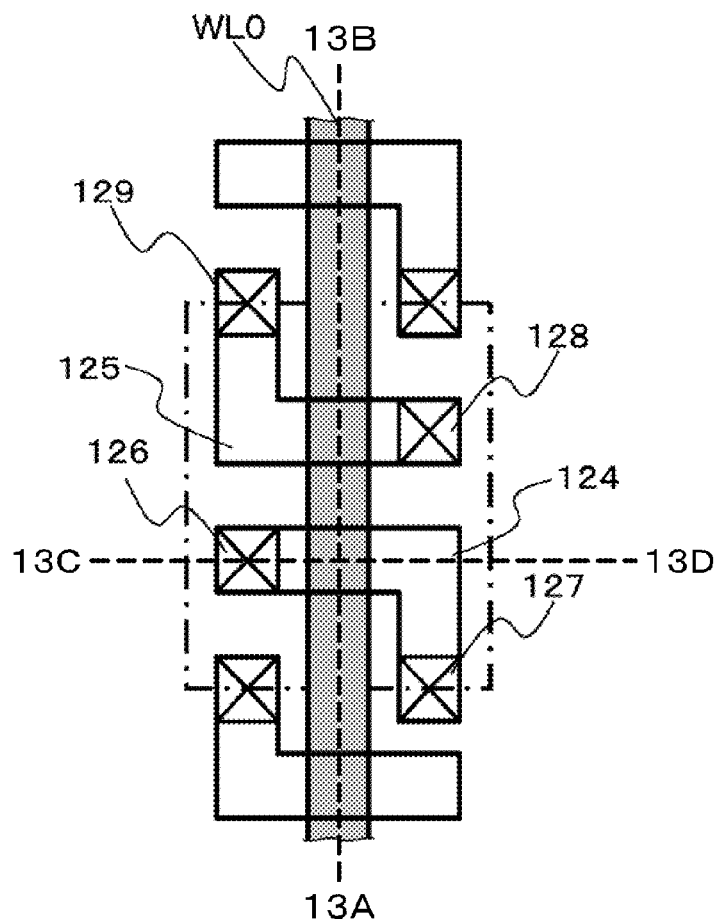
FIG. 13 is a surface diagram of the memory cell in the semiconductor memory device in accordance with another embodiment.
Figure 14:
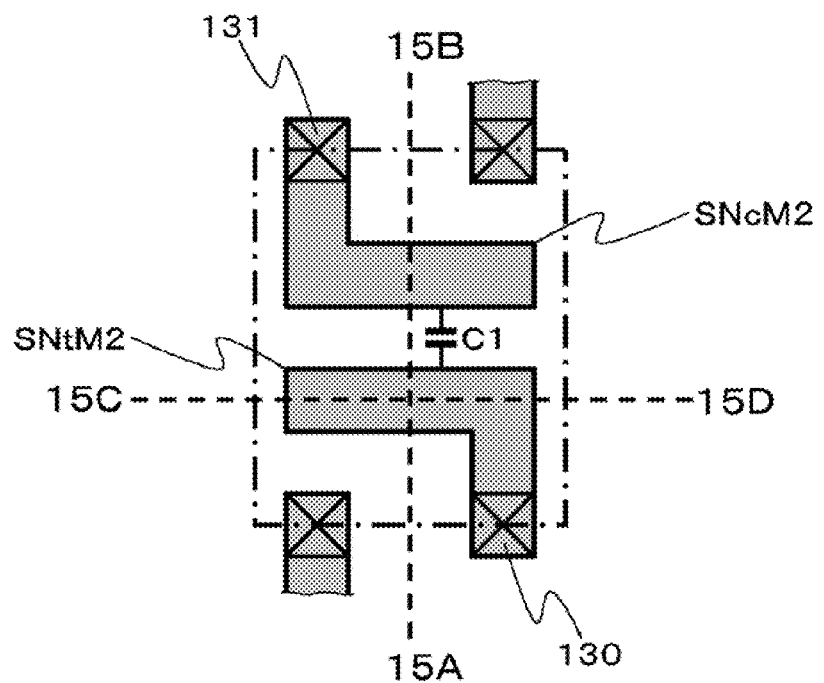
FIG. 14 is a cross-sectional view of the memory cell in the semiconductor memory device in accordance with another embodiment taken in a direction parallel with FIG. 13.
Figure 15:
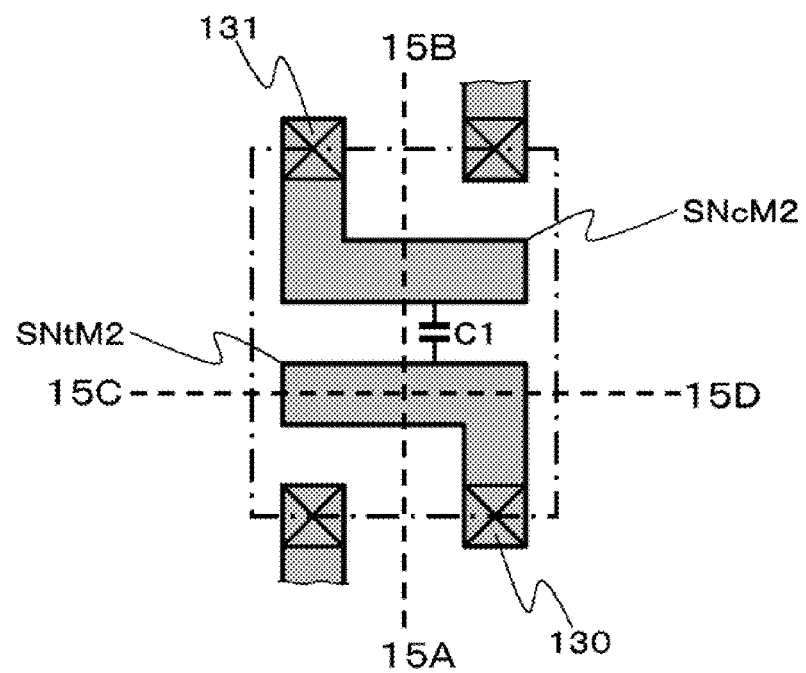
FIG. 15 is a cross-sectional view of the memory cell in the semiconductor memory device in accordance with another embodiment taken in a direction parallel with FIG. 13.
Figure 16:
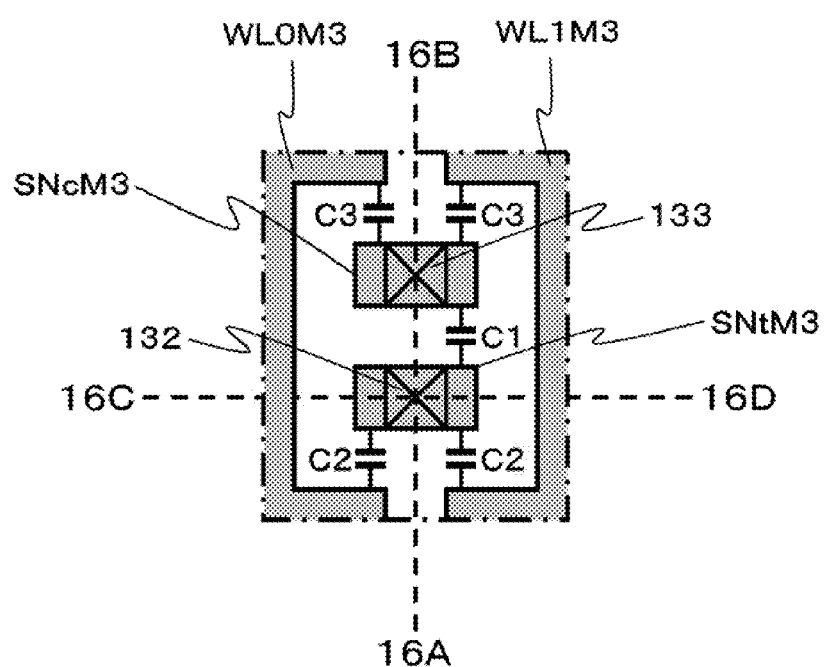
FIG. 16 is a cross-sectional view of the memory cell in the semiconductor memory device in accordance with another embodiment taken in a direction parallel with FIG. 13.
Figure 17:
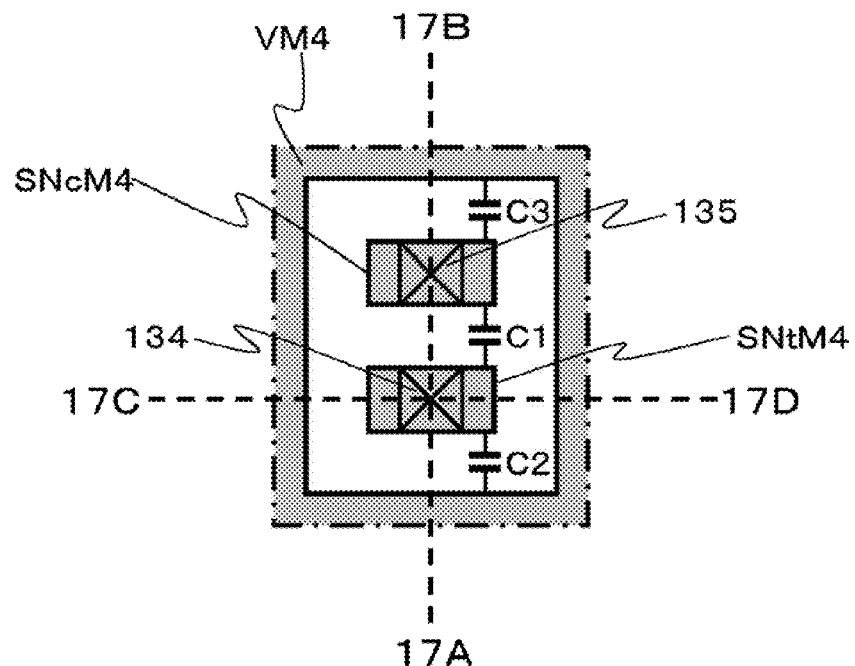
FIG. 17 is a cross-sectional view of the memory cell in the semiconductor memory device in accordance with another embodiment taken in a direction parallel with FIG. 13.
Figure 18:
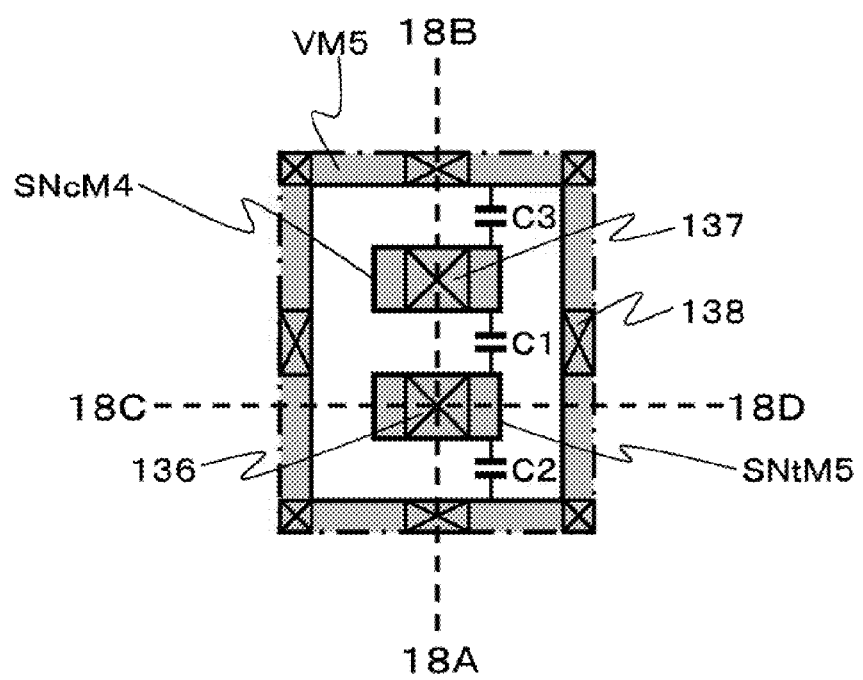
FIG. 18 is a cross-sectional view of the memory cell in the semiconductor memory device in accordance with another embodiment taken in a direction parallel with FIG. 13.

FIGS. 11-18 show a specific structure of the memory cell 11 for one bit shown in FIG. 1. FIGS. 11 and 12 are cross-sectional views taken in a direction vertical to a semiconductor substrate 121. FIG. 11 is a cross-sectional view taken vertical to the semiconductor substrate 121 along the line 12A-12B. FIG. 12 is also a cross-sectional view taken along the line 12A-12B but has an angle of 90 degrees from the cross-sectional view of FIG. 11. FIGS. 13-18 are cross-sectional views taken in a direction parallel with the semiconductor substrate 121. Namely, they are cross-sectional views vertical to the sections of FIGS. 11 and 12. FIG. 13 is a cross-sectional view taken along the line 13A-13B in FIG. 11 and the line 13C-13D in FIG. 12. FIG. 14 is a cross-sectional view taken along the line 14A-14B in FIG. 11 and the line 14C-14D in FIG. 12. FIG. 15 is a cross-sectional view taken along the line 15A-15B in FIG. 11 and the line 15C-15D in FIG. 12. FIG. 16 is a cross-sectional view taken along the line 16A-16B in FIG. 11 and the line 16C-16D in FIG. 12. FIG. 17 is a cross-sectional view taken along the line 17A-17B in FIG. 11 and the line 17C-17D in FIG. 12. FIG. 18 is a cross-sectional view taken along the line 18A-18B in FIG. 11 and the line 18C-18D in FIG. 12.

The present embodiment is directed to a semiconductor memory device having a multi-layered structure, which includes interlayer insulators 101 formed on the surface of the semiconductor substrate 121, and wiring patterns serving as electrodes formed between the interlayer insulators 101 three-dimensionally. This structure is described on the basis of FIGS. 11 and 12, layer by layer to be formed, based on FIGS. 13-18. A region surrounded by a dashed-chain line in the figures shows a memory cell region for one bit.

In the present embodiment, active regions 124 and 125 are formed in the semiconductor substrate 121 as shown in FIG. 13. The active region 124 is used to form a source region, a drain region and a channel region (not shown) of the transistor T1 therein. The active region 125 is used to form a source region, a drain region and a channel region (not shown) of the transistor T2 therein.

The semiconductor substrate 121 includes a device isolation layer (STI) 122 formed therein. The isolation layer 122 contributes to isolation between plural memory cells 11 and also contributes to isolation between the transistors T1 and T2 in one memory cell 11. Further, the word line WL0 is formed over the semiconductor substrate 121 and the isolation layer (STI) 122 formed in the surface thereof. Specifically, the word line WL0 is formed on the channel region of the transistor T1 in the active region 124 and on the channel region of the transistor T2 in the active region 125, with a gate insulator, not shown, interposed therebetween. The word line WL0 serves as gate electrodes of the transistors T1, T2.

An interlayer insulator 101 is formed on the semiconductor substrate 121, and an interlayer contact electrode 126 is formed through the interlayer insulator 101 down to the active region 124 used to form the transistor T1. The bit line BLt and the source region of the transistor T1 formed in the active region 124 are connected to each other via the interlayer contact electrode 126. The data-storage node SNt and the transistor T1 are connected to each other via an interlayer contact electrode 127. Similarly, an interlayer contact electrode 128 is formed through the interlayer insulator 101 down to the active region 125 used to form the transistor T2. The bit line BLc and the transistor T2 are connected to each other via the interlayer contact electrode 128. The data-storage node SNc and the transistor T2 are connected to each other via an interlayer contact electrode 129.

FIG. 14 is a cross-sectional view taken along the line 14A-14B in FIG. 11 and the line 14C-14D in FIG. 12. In the section of FIG. 14, an electrode BLtM1 serving as the bit line BLt, an electrode BLcM1 serving as the bit line BLc, an electrode SNtM1 serving as the data-storage node SNt, and an electrode SNcM1 serving as the data-storage node SNc are formed.

As described above, the electrode BLtM1 serving as the bit line BLt is connected to the transistor T1 via the interlayer contact electrode 126, and the electrode SNtM1 serving as the data-storage node SNt is connected to the transistor T1 via the interlayer contact electrode 127.

In addition, the electrode BLcM1 serving as the bit line BLc is connected to the transistor T1 via the interlayer contact electrode 128, and the electrode SNcM1 serving as the data-storage node SNc is connected to the transistor T1 via the interlayer contact electrode 129. The electrode BLtM1 serving as the bit line BLt is connected to the transistor T2 via the interlayer contact electrode 126, and the electrode SNtM1 serving as the data-storage node SNt is connected to the transistor T2 via the interlayer contact electrode 127.

FIG. 15 is a cross-sectional view taken along the line 15A-15B in FIG. 11 and the line 15C-15D in FIG. 12. In the section of FIG. 15, an electrode SNtM2 serving as the data-storage node SNt, and an electrode SNcM2 serving as the data-storage node SNc are formed.

As described above, the electrode SNcM2 serving as the data-storage node SNc is connected to the electrode SNcM1 via an interlayer contact electrode 131, and the electrode SNtM2 serving as the data-storage node SNt is connected to the electrode SNtM1 via an interlayer contact electrode 130.

In the section of FIG. 15, the electrode SNtM2 serving as the data-storage node SNt, the electrode SNcM2 serving as the data-storage node SNc, and the interlayer insulator 101 sandwiched between these two electrodes SNtM2 and SNcM2 form the capacitor C1.

FIG. 16 is a cross-sectional view taken along the line 16A-16B in FIG. 11 and the line 16C-16D in FIG. 12. In this section of FIG. 16, an electrode WL0M3 serving as the word line WL0, an electrode WL1M3 serving as the word line WL1, an electrode SNtM3 serving as the data-storage node SNt, and an electrode SNcM3 serving as the data-storage node SNc are formed.

The electrode SNtM3 serving as the data-storage node SNt is connected to the electrode SNtM2 via an interlayer contact electrode 132. The electrode SNcM3 serving as the data-storage node SNc is connected to the electrode SNcM2 via an interlayer contact electrode 133. The electrode WL0M3 serving as the word line WL0 is formed surrounding the two electrodes SNtM3, SNcM3 at least in part and, opposite to the electrode WL0M3, the electrode WL1M3 serving as the word line WL1 is formed surrounding the two electrodes SNtM3, SNcM3 at least in part.

In the section of FIG. 16, the interlayer insulator 101 sandwiched between the electrode SNtM3 serving as the data-storage node SNt and the electrode SNcM3 serving as the data-storage node SNc forms the capacitor C1. In addition, the interlayer insulator 101 sandwiched between the electrode SNtM3 serving as the data-storage node SNt and the electrode WL0M3 serving as the word line WL0 forms the capacitor C2, and the interlayer insulator 101 sandwiched between the electrode SNtM3 serving as the data-storage node SNt and the electrode WL1M3 serving as the word line WL1 forms the capacitor C2. Further, the interlayer insulator 101 sandwiched between the electrode SNcM3 serving as the data-storage node SNc and the electrode WL0M3 serving as the word line WL0 forms the capacitor C3, and the interlayer insulator 101 sandwiched between the electrode SNcM3 serving as the data-storage node SNc and the electrode WL1M3 serving as the word line WL1 forms the capacitor C3. An interlayer insulator 101 is formed over these electrodes SNcM3, SNtM3, WL0M3, and WL1M3, and then electrode patterns in the next layer (FIG. 17) are formed.

FIG. 17 is a cross-sectional view taken along the line 17A-17B in FIG. 11 and the line 17C-17D in FIG. 12. In the section of FIG. 17, an electrode VM4 for supplying power, an electrode SNtM4 serving as the data-storage node SNt, and an electrode SNcM4 serving as the data-storage node SNc are formed. The electrode SNtM4 serving as the data-storage node SNt is connected to the electrode SNtM3 via an interlayer contact electrode 134, and the electrode SNcM4 serving as the data-storage node SNc is connected to the electrode SNcM3 via an interlayer contact electrode 135. The electrode VM4 is formed in a closed-loop surrounding the two electrodes SNtM4 and SNcM4.

In the section of FIG. 17, the interlayer insulator 101 sandwiched between the electrode SNtM4 serving as the data-storage node SNt and the electrode SNcM4 serving as the data-storage node SNc forms the capacitor C1. In addition, the interlayer insulator 101 sandwiched between the electrode SNtM4 serving as the data-storage node SNt and the electrode VM4 for supplying power forms the capacitor C2. Further, the interlayer insulator 101 sandwiched between the electrode SNcM4 serving as the data-storage node SNc and the electrode VM4 for supplying power forms the capacitor C3. An interlayer insulator 101 is formed over these electrodes SNcM4, SNtM4, VM4, and then electrode patterns in the next layer (FIG. 18) are formed.

FIG. 18 is a cross-sectional view taken along the line 18A-18B in FIG. 11 and the line 18C-18D in FIG. 12. In this section of FIG. 18, an electrode VM5 for supplying power, an electrode SNtM5 serving as the data-storage node SNt, and an electrode SNcM5 serving as the data-storage node SNc are formed. The electrode SNtM5 serving as the data-storage node SNt is connected to the electrode SNtM4 via an interlayer contact electrode 136, and the electrode SNcM5 serving as the data-storage node SNc is connected to the electrode SNcM4 via an interlayer contact electrode 137. The electrode VM5 for supplying power is connected to the electrode VM4 via an interlayer contact electrode 138. The electrode VM5 is formed in a closed-loop surrounding the two electrodes SNtM5 and SNcM5.

Although the present embodiment forms a plurality of the interlayer contact electrodes 138, only one may be sufficient. If the interlayer contact electrodes 138 are formed plural, capacitive components formed between the interlayer contact electrodes contribute to increases in capacity of the capacitors C2, C3 to additionally increase the capacities of the capacitors C2, C3.

In the section of FIG. 18, the interlayer insulator 101 sandwiched between the electrode SNtM5 serving as the data-storage node SNt and the electrode SNcM5 serving as the data-storage node SNc forms the capacitor C1. In addition, the interlayer insulator 101 sandwiched between the electrode SNtM5 serving as the data-storage node SNt and the electrode VM5 for supplying power forms the capacitor C2. Further, the interlayer insulator 101 sandwiched between the electrode SNcM5 serving as the data-storage node SNc and the electrode VM5 for supplying power forms the capacitor C3.

Figure 19:
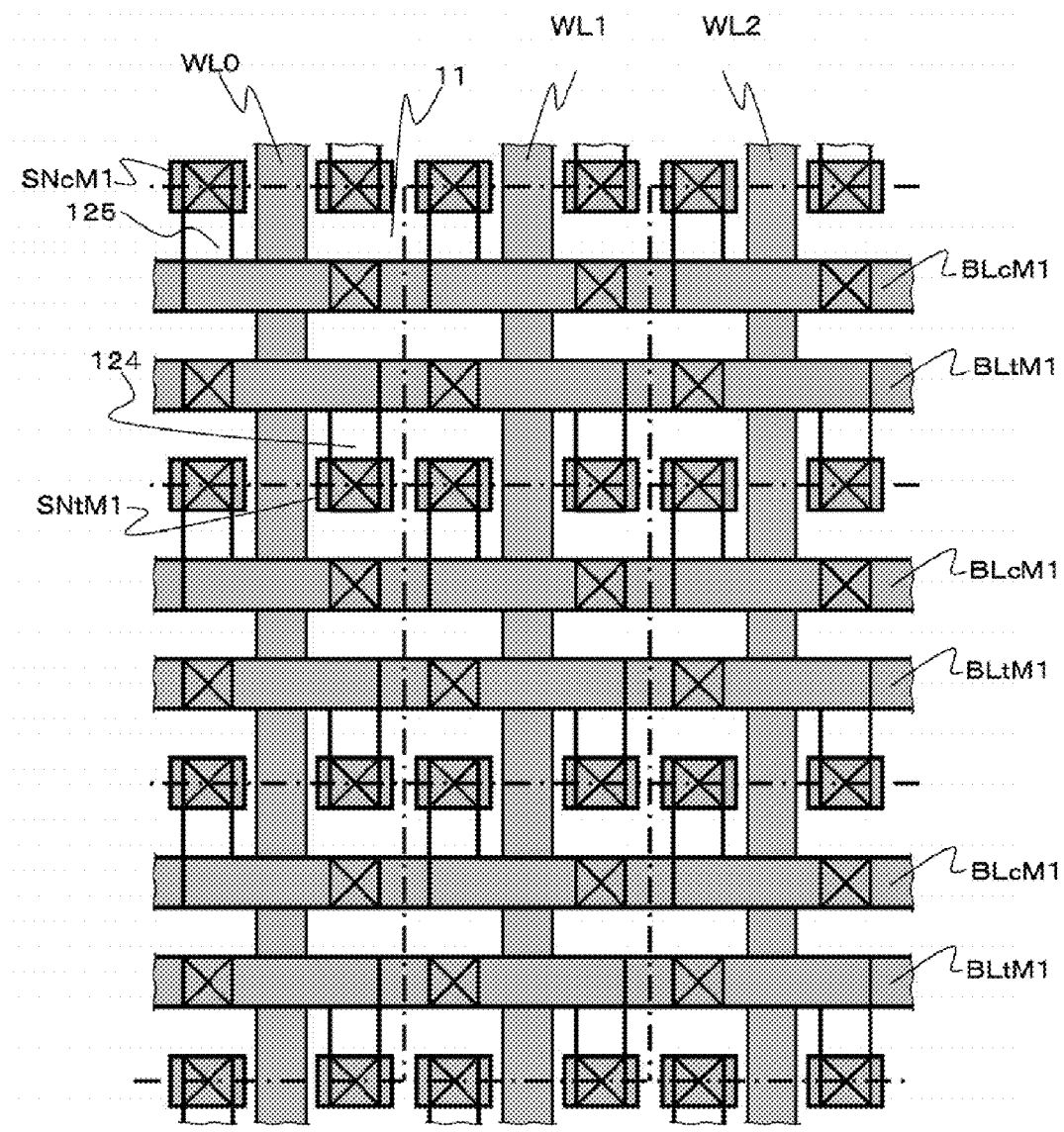
FIG. 19 is a surface arrangement diagram of a memory cell array in the semiconductor memory device in accordance with another embodiment.

FIG. 19 shows an arrangement of a memory cell array including the memory cells 11 formed therein in the present embodiment superimposing FIG. 13 on FIG. 14. The memory cells 11 are formed two-dimensionally. In each of the memory cells 11, the transistors T1, T2 are formed in the active regions 124 and 125 and the interlayer insulators 101 sandwiched between the electrodes BLtM1, BLcM1, SNtM1, and SNcM1 form the capacitors C1, C2, and C3. Three-dimensional formation of the two-dimensionally formed memory cells 11 allows the interlayer insulators 101 sandwiched between the electrodes in the upper and lower layers to form the capacitors C1, C2, and C3. As a result, the total capacity of the whole memory cells becomes sufficient for DRAM operation. In a usual CMOS process, for a reduction in parasitic capacity, a silicon oxide (such as $SiO_2$) having a relative permittivity of 5 or below is used as the interlayer insulator. Even in such the case, the memory cells three-dimensionally structured in accordance with the present embodiment make it possible to ensure necessary and sufficient capacities for DRAM operation.

The present embodiment allows the interlayer insulators to be used as capacitors in a DRAM. As a result, the usual CMOS process can be used to obtain a DRAM having a cell area equal to 40-60% of that in the SRAM.

Figure 20:
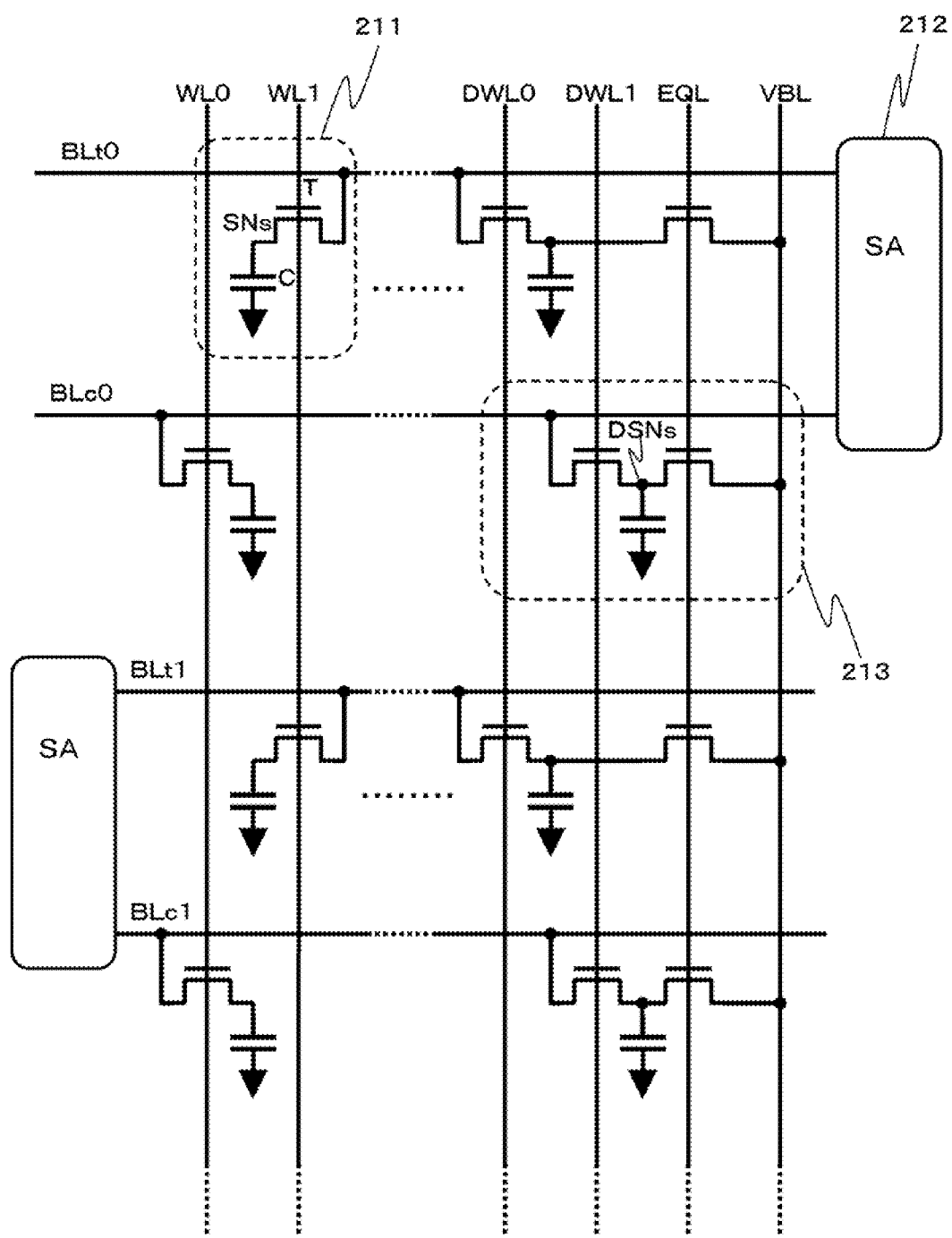
FIG. 20 is a diagram showing a circuit of a semiconductor memory device in accordance with yet another embodiment.

A third embodiment of the present invention is described next. The present embodiment relates to a DRAM that uses one transistor and one capacitor to configure a memory cell for one bit. FIG. 20 shows a circuit diagram of memory cells in the present embodiment. A memory cell array in the present embodiment includes two types of complementary bit lines. The number of the bit lines is (N+1), respectively. Specifically, it includes bit lines BLtk, BLck (k=0-N).

Word lines are provided. The number of word lines is M+1. Specifically, it includes word lines WLj (j=0-M). Further, dummy word lines DWL0, DWL1 are provided.

The memory cells 211 in the present embodiment are formed in regions at intersections of the complementary bit lines BLtk, BLck (k=0-N) and the word lines WLj (j=0-M). Such the arrangement of the memory cells is called the folded bit-line arrangement. For example, a memory cell 211 is formed in a region at an intersection of complementary bit lines BLt0, BLc0 and a word line WL1 as shown in FIG. 20.

In addition, a dummy cell 213 is formed in a region at an intersection of the complementary bit lines BLt0, BLc0 and the dummy word line DWL1.

A memory cell 211 includes an N-type MOS transistor T and a capacitor C. The N-type MOS transistor T has a source connected to the bit line BLt0. The N-type MOS transistor T has a gate connected to the word line WL1. The N-type MOS transistor T has a drain connected to the capacitor C. Thus, a data-storage node SNs is formed in the connection region between the drain of the N-type MOS transistor T and the capacitor C. The complementary bit lines BLt0 and BLc0 are connected to a sense amp (SA) 212, which can read out stored information. Dummy cells 213 are formed in the regions at intersections of the complementary bit line BLtk or BLck (k=0-N), the dummy word line DWL0 or DWL1, and lines EQL, VBL for supplying voltages required for driving the dummy cells.

Figure 21:
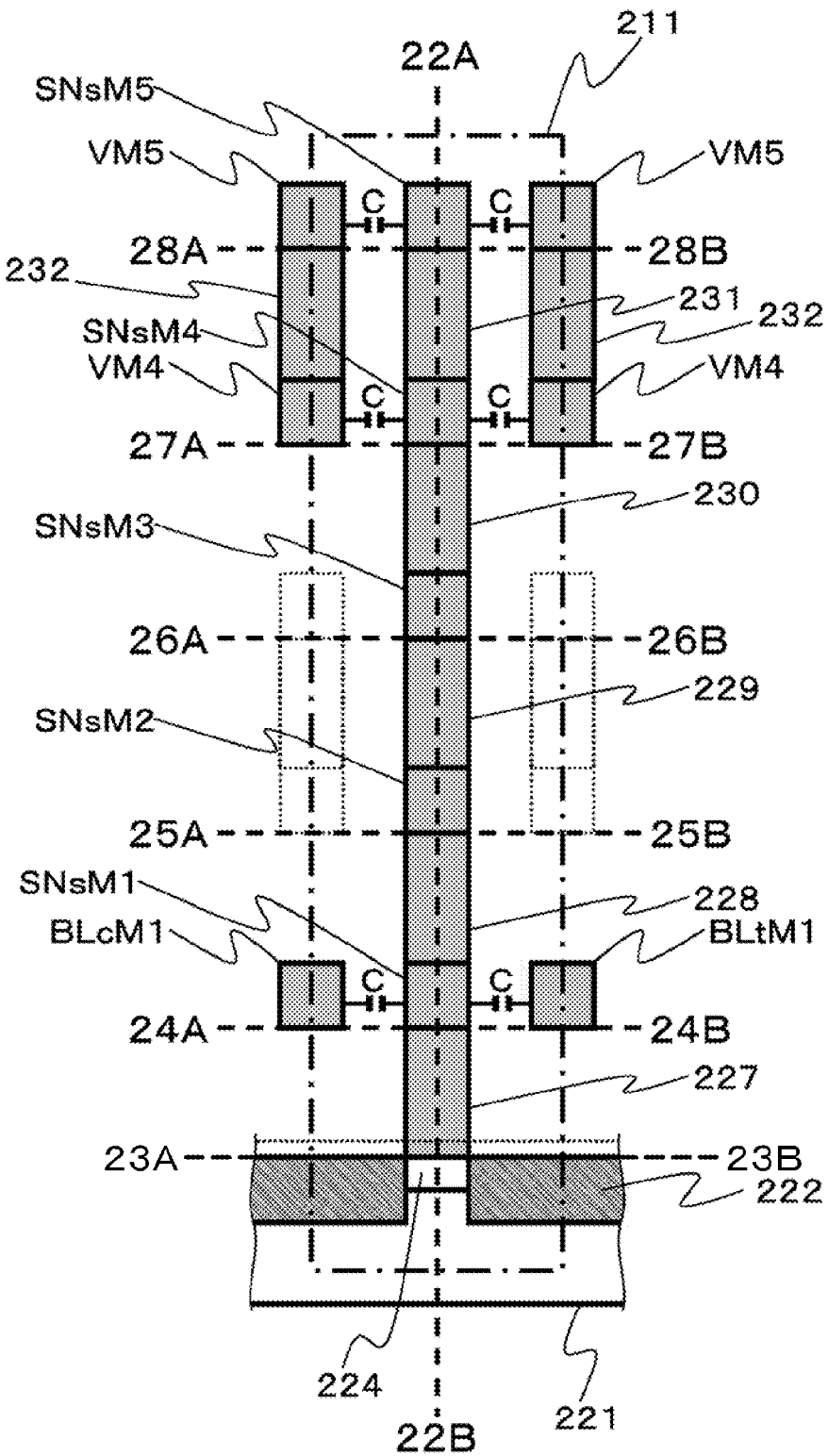
FIG. 21 is a cross-sectional view of a memory cell in a semiconductor memory device in accordance with yet another embodiment taken in a direction vertical to a substrate.
Figure 22:
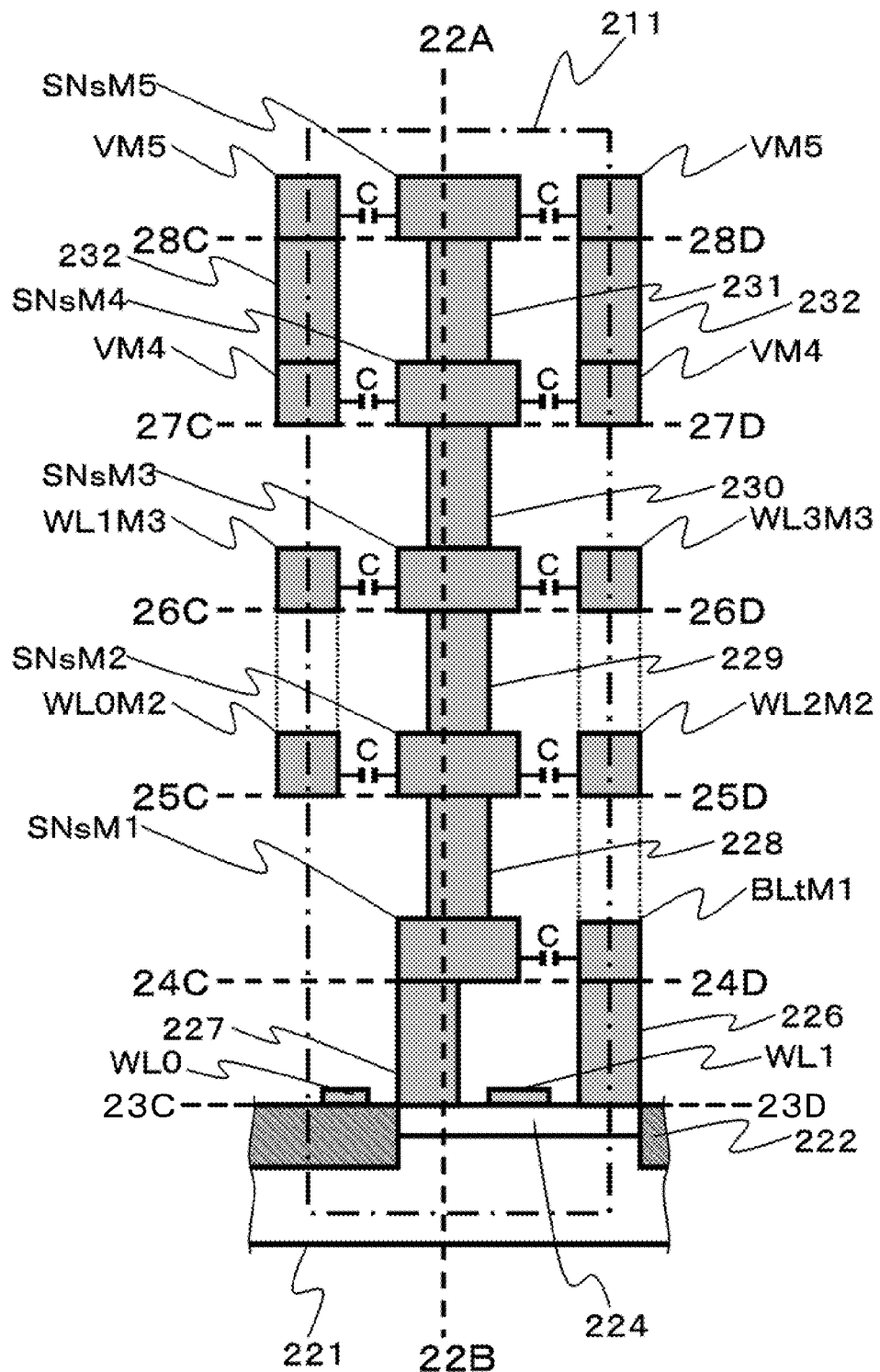
FIG. 22 is a cross-sectional view of the memory cell in the semiconductor memory device in accordance with yet another embodiment taken in a direction vertical to the substrate.
Figure 23:
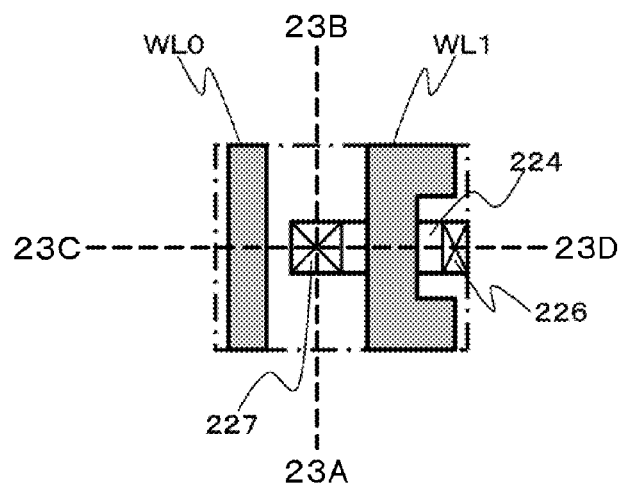
FIG. 23 is a surface diagram of a semiconductor substrate for the memory cell in the semiconductor memory device in accordance with yet another embodiment.
Figure 24:
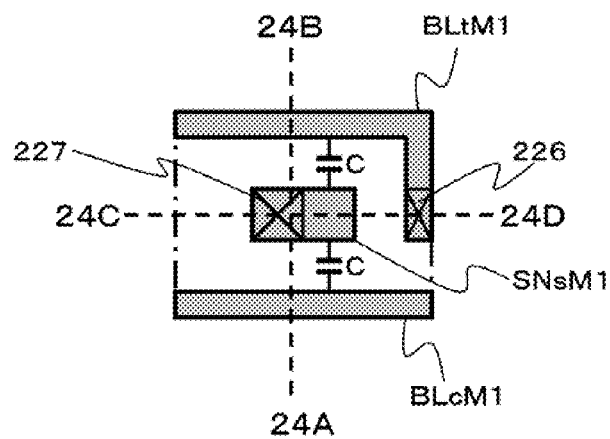
FIG. 24 is a cross-sectional view (1) of the memory cell in the semiconductor memory device in accordance with yet another embodiment taken in a direction parallel with FIG. 23.
Figure 25:
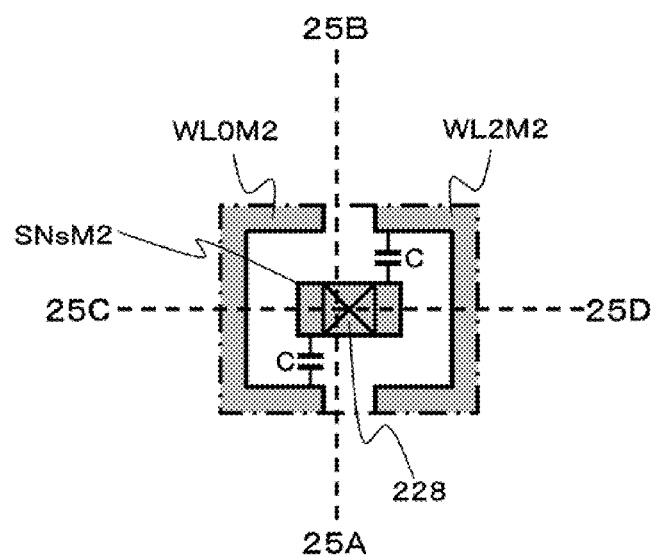
FIG. 25 is a cross-sectional view of the memory cell in the semiconductor memory device in accordance with yet another embodiment taken in a direction parallel with FIG. 23.
Figure 26:
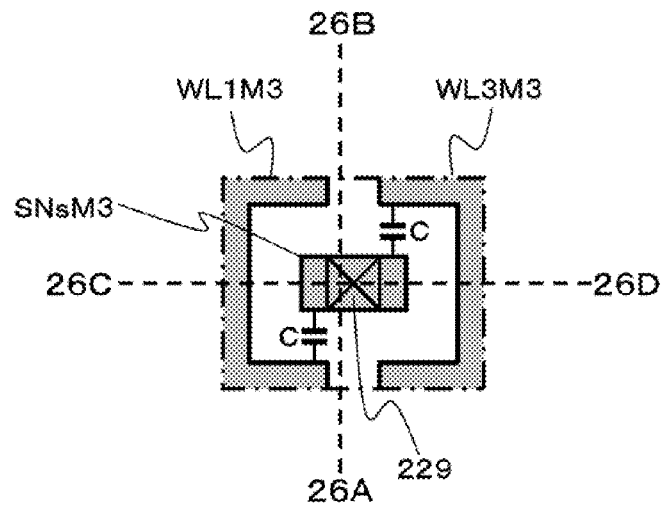
FIG. 26 is a cross-sectional view of the memory cell in the semiconductor memory device in accordance with yet another embodiment taken in a direction parallel with FIG. 23.
Figure 27:
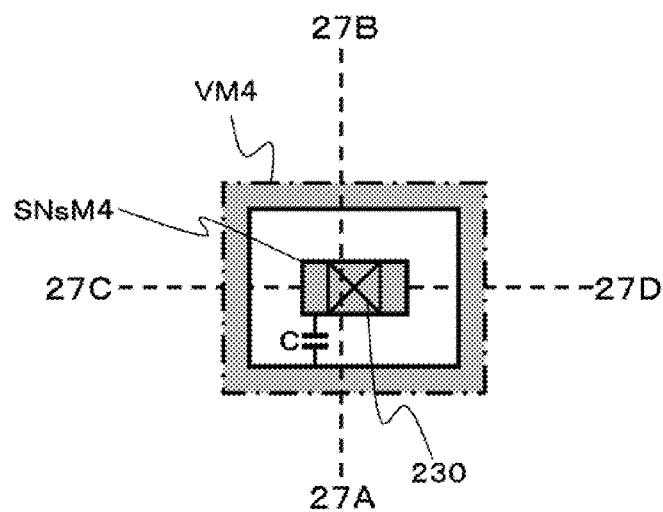
FIG. 27 is a cross-sectional view of the memory cell in the semiconductor memory device in accordance with yet another embodiment taken in a direction parallel with FIG. 23.
Figure 28:
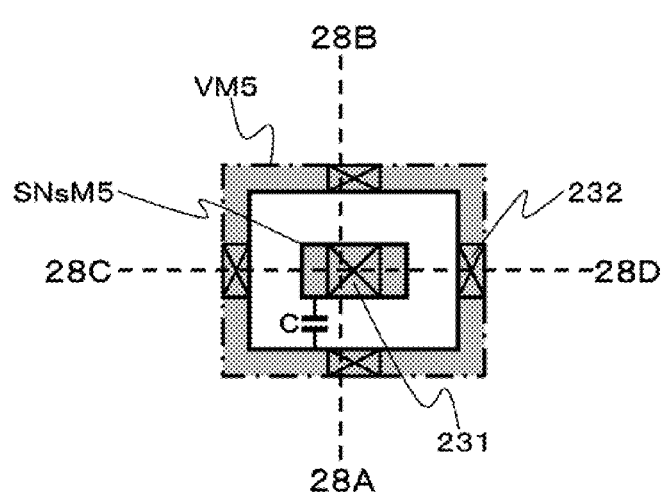
FIG. 28 is a cross-sectional view of the memory cell in the semiconductor memory device in accordance with yet another embodiment taken in a direction parallel with FIG. 23.

FIGS. 21-28 show a specific structure of the memory cell 211 for one bit shown in FIG. 20. FIGS. 21 and 22 are cross-sectional views taken in a direction vertical to a semiconductor substrate 221. FIG. 21 is a cross-sectional view taken vertical to the semiconductor substrate 221 along the line 22A-22B. FIG. 22 is also a cross-sectional view taken along the line 22A-22B but has an angle of 90 degrees from the cross-sectional view of FIG. 21. FIGS. 23-28 are cross-sectional views taken in a direction parallel with the semiconductor substrate 221. Namely, they are cross-sectional views vertical to the sections of FIGS. 21 and 22. FIG. 23 is a cross-sectional view taken along the line 23A-23B in FIG. 21 and the line 23C-23D in FIG. 22. FIG. 24 is a cross-sectional view taken along the line 24A-24B in FIG. 21 and the line 24C-24D in FIG. 22. FIG. 25 is a cross-sectional view taken along the line 25A-25B in FIG. 21 and the line 25C-25D in FIG. 22. FIG. 26 is a cross-sectional view taken along the line 26A-26B in FIG. 21 and the line 26C-26D in FIG. 22. FIG. 27 is a cross-sectional view taken along the line 27A-27B in FIG. 21 and the line 27C-27D in FIG. 22. FIG. 28 is a cross-sectional view taken along the line 28A-28B in FIG. 21 and the line 28C-28D in FIG. 22.

The present embodiment is directed to a semiconductor memory device having a multi-layered structure, which includes interlayer insulators 101 formed on the surface of the semiconductor substrate 221, and wiring patterns serving as electrodes formed between the interlayer insulators 101 three-dimensionally. This structure is described on the basis of FIGS. 21 and 22, layer by layer to be formed, based on FIGS. 23-28. A region surrounded by a dashed-chain line in the figures shows a memory cell region for one bit.

In the present embodiment, an active region 224 is formed in the semiconductor substrate 221 as shown in FIG. 23. The active region 224 is used to form a source region, a drain region and a channel region (not shown) of the transistor T therein.

The semiconductor substrate 221 includes a device isolation layer (STI) 222 formed therein. The isolation layer 222 contributes to isolation between plural memory cells 211 and also contributes to isolation between the memory cell 211 and the dummy cell 213. Further, the word lines WL0, WL1 are formed over the semiconductor substrate 221 and the isolation layer (STI) 222 formed in the surface thereof. Specifically, the word line WL1 is formed on the channel region of the transistor T in the active region 224 with a gate insulator, not shown, interposed therebetween.

An interlayer insulator 101 is formed on the semiconductor substrate 221, and an interlayer contact electrode 226 is formed through the interlayer insulator 101 down to the active region 224 used to form the transistor T therein. The bit line BLt and the transistor T are connected to each other via the interlayer contact electrode 226. The data-storage node SNs and the transistor T are connected to each other via an interlayer contact electrode 227.

FIG. 24 is a cross-sectional view taken along the line 24A-24B in FIG. 21 and the line 24C-24D in FIG. 22. In the section of FIG. 24, an electrode BLtM1 serving as the bit line BLt, an electrode BLcM1 serving as the bit line BLc, and an electrode SNsM1 serving as the data-storage node SNs are formed. The electrode BLtM1 serving as the bit line BLt is connected to the transistor T via the interlayer contact electrode 226, and the electrode SNsM1 serving as the data-storage node SNs is connected to the transistor T via the interlayer contact electrode 227.

In the section of FIG. 24, the interlayer insulator 101 sandwiched between the electrode SNsM1 serving as the data-storage node SNs and the electrode BLtM1 serving as the bit line BLt forms the capacitor C. In addition, the interlayer insulator 101 sandwiched between the electrode SNsM1 serving as the data-storage node SNs and the electrode BLcM1 serving as the bit line BLc forms the capacitor C. An interlayer insulator 101 is formed over these electrodes SNsM1, BLtM1, BLcM1, and then electrode patterns in the next layer (FIG. 25) are formed.

FIG. 25 is a cross-sectional view taken along the line 25A-25B in FIG. 21 and the line 25C-25D in FIG. 22. In this section of FIG. 25, an electrode WL0M2 serving as the word line WL0, an electrode WL2M2 serving as a word line WL2, and an electrode SNsM2 serving as the data-storage node SNs are formed. The electrode SNsM2 serving as the data-storage node SNs is connected to the electrode SNsM1 via an interlayer contact electrode 228. The electrode WL0M2 serving as the word line WL0 is formed surrounding the node SNsM2 at least in part. In addition, opposite to the electrode WL0M2, the electrode WL2M2 serving as the word line WL2 is formed surrounding the node SNsM2 at least in part.

In the section of FIG. 25, the interlayer insulator 101 sandwiched between the electrode SNsM2 serving as the data-storage node SNs and the electrode WL0M2 serving as the word line WL0 forms the capacitor C. In addition, the interlayer insulator 101 sandwiched between the electrode SNsM2 serving as the data-storage node SNs and the electrode WL2M2 serving as the word line WL2 forms the capacitor C. An interlayer insulator 101 is formed over these electrodes SNsM2, WL0M2, WL2M2, and then electrode patterns in the next layer (FIG. 26) are formed.

FIG. 26 is a cross-sectional view taken along the line 26A-26B in FIG. 21 and the line 26C-26D in FIG. 22. In the section of FIG. 26, an electrode WL1M3 serving as the word line WL1, an electrode WL3M3 serving as a word line WL3, an electrode SNsM3 serving as the data-storage node SNs are formed. The electrode SNsM3 serving as the data-storage node SNs is connected to the electrode SNsM2 via an interlayer contact electrode 229. The electrode WL1M3 serving as the word line WL1 is formed surrounding the electrode SNsM3 in part. In addition, opposite to the electrode WL1M3, the electrode WL3M3 serving as the word line WL3 is formed surrounding the node SNsM3 at least in part.

In the section of FIG. 26, the interlayer insulator 101 sandwiched between the electrode SNsM3 serving as the data-storage node SNs and the electrode WL1M3 serving as the word line WL1 forms the capacitor C. In addition, the interlayer insulator 101 sandwiched between the electrode SNsM3 serving as the data-storage node SNs and the electrode WL3M3 serving as the word line WL3 forms the capacitor C. An interlayer insulator 101 is formed over these electrodes SNsM3, WL1M3, WL3M3, and then electrode patterns in the next layer (FIG. 27) are formed.

FIG. 27 is a cross-sectional view taken along the line 27A-27B in FIG. 21 and the line 27C-27D in FIG. 22. In the section of FIG. 27, an electrode VM4 for supplying power, and an electrode SNsM4 serving as the data-storage node SNs are formed. The electrode SNsM4 serving as the data-storage node SNs is connected to the electrode SNsM3 via an interlayer contact electrode 230. The electrode VM4 is formed in a closed-loop surrounding the electrode SNsM4.

In the section of FIG. 27, the interlayer insulator 101 sandwiched between the electrode SNsM4 serving as the data-storage node SNs and the electrode VM4 for supplying power forms the capacitor C. An interlayer insulator 101 is formed over these electrodes SNsM4, VM4, and then electrode patterns in the next layer (FIG. 28) are formed.

FIG. 28 is a cross-sectional view taken along the line 28A-28B in FIG. 21 and the line 28C-28D in FIG. 22. In this section of FIG. 28, an electrode VM5 for supplying power, and an electrode SNsM5 serving as the data-storage node SNs are formed. The electrode SNsM5 serving as the data-storage node SNs is connected to the electrode SNsM4 via an interlayer contact electrode 231. The electrode VM5 for supplying power is connected to the electrode VM4 via an interlayer contact electrode 232. The electrode VM5 is formed in a closed-loop surrounding the electrode SNsM5.

In the present embodiment the interlayer contact electrodes 232 are formed plural though only one may be sufficient. If the interlayer contact electrodes 232 are formed plural, capacitive components formed between the interlayer contact electrodes contribute to increases in capacity of the capacitor C to additionally increase the capacity.

In the section of FIG. 28, the interlayer insulator 101 sandwiched between the electrode SNsM5 serving as the data-storage node SNs and the electrode VM5 for supplying power forms the capacitor C.

Figure 29:
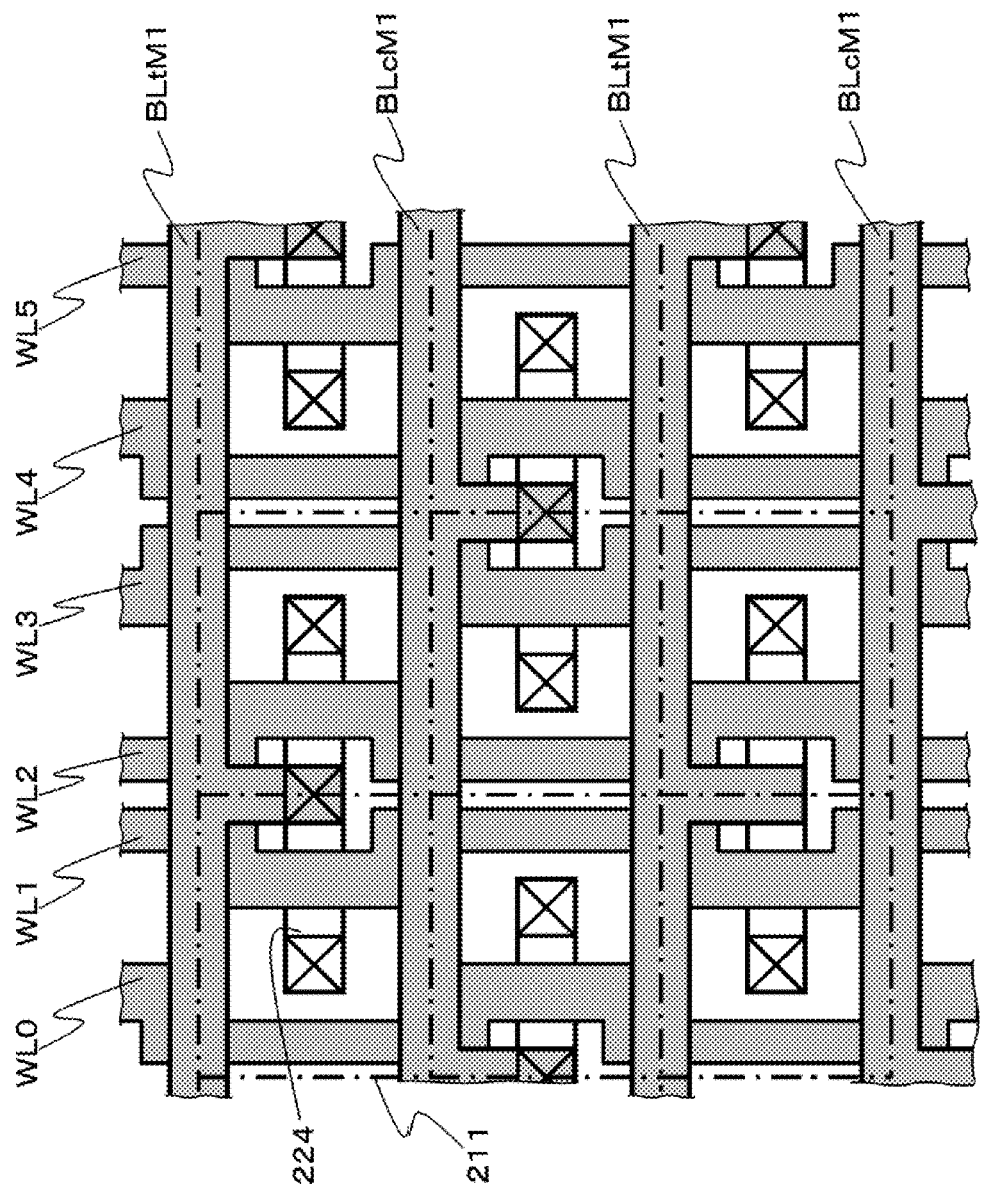
FIG. 29 is a surface arrangement diagram of a memory cell array in the semiconductor memory device in accordance with yet another embodiment.

FIG. 29 shows an arrangement of a memory cell array including the memory cells 211 formed therein in the present embodiment superimposing FIG. 23 on FIG. 24. The memory cell array is formed such that the memory cells 211 are alternately rotated 180 degrees in the direction vertical to the page and arranged laterally and longitudinally. The memory cells 211 are formed two-dimensionally. Each of the memory cells 211 includes the transistor T and the capacitor C formed in a respective active region 224.

Three-dimensional formation of the two-dimensionally formed memory cell array allows the interlayer insulators 101 sandwiched between the electrodes in the upper and lower layers to form the capacitor C. As a result, the total capacity of the whole memory cells becomes sufficient for DRAM operation. In a usual CMOS process, for a reduction in parasitic capacity, a silicon oxide (such as $SiO_2$) having a relative permittivity of 5 or below is used as the interlayer insulator. Even in such the case, the memory cells three-dimensionally structured in accordance with the present embodiment make it possible to ensure necessary and sufficient capacities for DRAM operation.

The present embodiment allows the interlayer insulators to be used as the capacitor in a DRAM. As a result, the usual CMOS process can be used to obtain a DRAM having a cell area equal to 30-50% of that in the SRAM.

Several embodiments of the semiconductor memory device in accordance with the present invention have been described in detail above by way of example only. The present invention is not limited to the above embodiments but rather can be variously modified and varied without departing from the scope and spirit of the invention as recited in the appended claims as has been known by the skilled person in the art.

What is claimed is:

1. A semiconductor memory device, comprising:
a memory cell array including a plurality of memory cells arranged at intersections of bit line pairs and word lines,
wherein each of said memory cells includes a transistor having one main electrode connected to one bit line of said bit line pair, said transistor being formed on a substrate, a node electrode for data-storage connected to the other main electrode of said transistor, said node electrode being formed above the transistor via an interlayer insulator, said interlayer insulator formed between multilayered wirings, a shield electrode with a closed loop shape surrounding said node electrode in a horizontal plane parallel to the substrate via said interlayer insulator, and a capacitor including said interlayer insulator between said node electrode and another electrode, said capacitor being configured to store data in said node electrode,
wherein said transistor has a gate connected to said word line,
wherein said bit line pair is connected to an identical sense amp,
wherein said bit line pair, said word line, said node electrode and said shield electrode are electrically isolated from one another with the interlayer insulator interposed there between.

2. The semiconductor memory device according to claim 1, wherein said memory cell array further includes dummy word lines, and dummy cells arranged at intersections of said bit lines and said dummy word lines.

3. The semiconductor memory device according to claim 1, wherein said interlayer insulator is composed of a material having a relative permittivity of 5 or below.

* * * * *